US010461698B2

(12) United States Patent
Matsumoto

(10) Patent No.: US 10,461,698 B2
(45) Date of Patent: Oct. 29, 2019

(54) SIGNAL PROCESSING APPARATUS AND METHOD

(71) Applicant: Sony Corporation, Tokyo (JP)

(72) Inventor: Tomohiro Matsumoto, Kanagawa (JP)

(73) Assignee: Sony Corporation, Tokyo (JP)

(*) Notice: Subject to any disclaimer, the term of this patent is extended or adjusted under 35 U.S.C. 154(b) by 34 days.

(21) Appl. No.: 15/547,167

(22) PCT Filed: Jan. 22, 2016

(86) PCT No.: PCT/JP2016/051800
§ 371 (c)(1),
(2) Date: Jul. 28, 2017

(87) PCT Pub. No.: WO2016/125600
PCT Pub. Date: Aug. 11, 2016

(65) Prior Publication Data
US 2018/0019707 A1 Jan. 18, 2018

(30) Foreign Application Priority Data

Feb. 5, 2015 (JP) ................. 2015-021075

(51) Int. Cl.
*H03K 21/00* (2006.01)
*H03D 7/16* (2006.01)
(Continued)

(52) U.S. Cl.
CPC ........... *H03D 7/168* (2013.01); *H03D 7/1441* (2013.01); *H03D 7/1466* (2013.01);
(Continued)

(58) Field of Classification Search
CPC ........... H03D 7/168; H03D 2200/0086; H03D 7/165; H03D 7/1466; H03D 7/1441;
(Continued)

(56) References Cited

U.S. PATENT DOCUMENTS 4,975,903 A * 12/1990 Wakerly ................ H04L 12/403
370/365
7,986,192 B2 * 7/2011 Lee .......................... H03D 7/18
331/37
(Continued)

OTHER PUBLICATIONS

Fabio, Ivan et al., "Saw-Less Analog Front-End Receivers for TDD and FDD" IEEE Journal of Solid-State Circuits, vol. 48, No. 12, Dec. 2013.

*Primary Examiner* — Ryan Jager
(74) *Attorney, Agent, or Firm* — Michael Best & Friedrich LLP

(57) ABSTRACT

The present technology relates to a signal processing apparatus and method capable of increasing a harmonic rejection ratio while suppressing an increase in power consumption. In one aspect of the present technology, two local signals having a 1/3 duty ratio and phases mutually shifted by a 1/2 period are mixed with each signal of a differential signal, and a difference between results of the mixing of the two local signals is calculated. The present technology can be applied to, for example, a signal processing apparatus, a transmission apparatus, a reception apparatus, a communication apparatus, an electronic apparatus having a transmission function, a reception function, or a communication function, or a computer that controls those apparatuses.

18 Claims, 20 Drawing Sheets

(51) Int. Cl.
*H04B 1/26* (2006.01)
*H03K 3/017* (2006.01)
*H03K 21/02* (2006.01)
*H03D 7/14* (2006.01)
*H03K 5/15* (2006.01)
*H04B 1/12* (2006.01)

(52) U.S. Cl.
CPC .......... *H03D 7/1483* (2013.01); *H03D 7/165* (2013.01); *H03K 3/017* (2013.01); *H03K 5/15093* (2013.01); *H03K 21/023* (2013.01); *H04B 1/123* (2013.01); *H04B 1/26* (2013.01); *H03D 2200/0084* (2013.01); *H03D 2200/0086* (2013.01); *H04B 1/12* (2013.01)

(58) Field of Classification Search
CPC ......... H03D 7/1483; H03D 2200/0084; H04B 1/123; H04B 1/26; H04B 1/12; H03K 5/15093; H03K 21/023; H03K 3/017
USPC ........................................................ 327/115
See application file for complete search history.

(56) References Cited

U.S. PATENT DOCUMENTS

| | | | |
|---|---|---|---|
| 8,588,723 B2* | 11/2013 | Chen | H04B 1/28 455/307 |
| 2010/0156538 A1* | 6/2010 | Ogasawara | H03F 3/19 330/277 |
| 2013/0137386 A1* | 5/2013 | Sivonen | H04B 1/109 455/90.2 |
| 2014/0320208 A1* | 10/2014 | Sheng | H03F 1/0272 330/261 |
| 2015/0333786 A1* | 11/2015 | Gard | H04B 1/30 375/346 |
| 2016/0330050 A1* | 11/2016 | Li | H04L 25/4902 |
| 2018/0191301 A1* | 7/2018 | Moon | H03B 19/00 |

* cited by examiner

SIGNAL PROCESSING APPARATUS AND METHOD

TECHNICAL FIELD

The present technology relates to a signal processing apparatus and method, and more particularly to, a signal processing apparatus and method capable of increasing a harmonic rejection ratio (HRR) while suppressing an increase in power consumption.

BACKGROUND ART

In recent years, in Low-IF or Zero-IF receivers, there may be a risk that not only an RF signal at a frequency of a desired LO signal but also an RF signal at an odd multiple of the frequency of the LO signal are down-converted into signals having the same baseband frequency. For example, a signal of a WLAN (Wireless Local Area Network) of 2.4 GHz has just a threefold frequency with respect to a TV RF signal of 800 MHz. For that reason, there has been a risk that the signal of the WLAN undergoes crosstalk when the TV signal is received.

For that reason, in the receivers, there has been a demand for setting a value of a harmonic rejection ratio to be larger. The harmonic rejection ratio is a ratio of a down-conversion component from an original desired LO signal frequency to a down-conversion component from a threefold or fivefold frequency of an unintended LO signal frequency.

For example, there is a method of adding three signal paths in which a gain and a phase of an LO signal are shifted, to suppress down-conversion of an RF signal having a threefold or fivefold frequency of the LO signal frequency. However, use of this method has needed a large current in order to provide sufficient performance, and there has been a risk that power consumption is increased.

Further, a resonator mixer has been conceived. The resonator mixer is provided with a parallel LC resonator that is provided immediately subsequent to a switch of the mixer and resonates at a fourfold frequency of that of an LO signal, and suppresses down-conversion of a frequency component having a threefold or fivefold frequency of that of the LO signal, which is included in an RF signal (see, for example, Non-Patent Literature 1).

CITATION LIST

Non-Patent Literature

Non-Patent Literature 1: Fabiano I, Sosio M, Liscidini A, Castello R, "SAN-Less Analog Front-End Receivers for TDD and FDD", Solid-State Circuits, IEEE Journal of Volume: 48, Issue: 12 2013, Page(s): 3067-3079.

DISCLOSURE OF INVENTION

Technical Problem

However, for example, in a case of a silicon tuner, a harmonic rejection ratio of about 40 dB is necessary. In the resonator mixer disclosed in Non-Patent Literature 1, however, it has been difficult to ensure a harmonic rejection ratio of 20 dB or more.

The present technology has been proposed in view of the circumstances as described above and it is an object of the present technology to increase a harmonic rejection ratio while suppressing an increase in power consumption.

Solution to Problem

One aspect of the present technology is a signal processing apparatus including a mixing section that has a differential configuration, mixes two local signals with each signal of a differential signal, and calculates a difference between results of the mixing of the two local signals, the two local signals having a 1/3 duty ratio and phases mutually shifted by a 1/2 period.

The signal processing apparatus can further include a resonance section that resonates with the differential signal, with which the local signals are mixed by the mixing section, at a predetermined resonant frequency.

The resonance section can resonate at a sixfold frequency of a frequency of the local signals.

The resonance section can include a parallel LC circuit.

The resonant frequency can be variable.

The signal processing apparatus can further include a voltage/current conversion section that converts a voltage into a current with respect to the differential signal, in which the mixing section can mix the local signals with the differential signal output from the voltage/current conversion section.

The signal processing apparatus can further include a capacitor between an output of the voltage/current conversion section and a ground potential.

The signal processing apparatus can further include a differential amplification section that amplifies the differential signal, with which the local signals are mixed by the mixing section.

The mixing section can include a path of an I channel and a path of a Q channel and mix the local signals having a mutual phase difference of 90 degrees with the I channel and the Q channel of the differential signal.

The signal processing apparatus can further include a local signal generation section that generates the local signals, in which the mixing section can mix the local signals with the differential signal, the local signals being generated by the local signal generation section.

Further, one aspect of the present technology is a signal processing method including mixing two local signals with each signal of a differential signal and calculating a difference between results of the mixing of the two local signals, the two local signals having a 1/3 duty ratio and phases mutually shifted by a 1/2 period.

Another aspect of the present technology is a signal processing apparatus including a generation section that generates two local signals to be mixed with a differential signal, the two local signals having a 1/3 duty ratio and phases mutually shifted by a 1/2 period.

The generation section can include a plurality of flip-flops mutually connected in series in a ring form, and a computing section that calculates a logical OR of an input and an output of each of the flip-flops.

The generation section can cause each of the flip-flops to sequentially hold a value "1" according to an input clock signal.

A frequency of the clock signal can be a sixfold frequency of a frequency of the local signals, and the generation section can have a ring configuration constituted of the six flip-flops and the six computing sections and output the two local signals that are outputs of the two computing sections separated from each other with other two computing sections therebetween.

The generation section can include two sets of the ring configuration, and generate the local signal for the I channel by one of the sets of the ring configuration and the local signal for the Q channel by the other one of the sets of the ring configuration, the local signal for the Q channel having a phase difference of 90 degrees from the local signal for the I channel.

The generation section can include a frequency divider section that generates the local signals having a 1/3 frequency and a 1/3 duty ratio with respect to a clock signal having a threefold frequency of a frequency of the local signals.

The frequency divider section can include a counter that counts the clock signal, a reset control section that resets the counter to "0" when an output. value of the counter reaches "3", and an output control section that outputs a value "1" when a value of the counter is "2", and outputs a value "0" when the output value of the counter is "1" or "0".

The signal processing apparatus can further include a mixing section that mixes the local signals generated by the generation section with each signal of the differential signal.

Further, another aspect of the present technology is a signal processing method including generating two local signals to be mixed with a differential signal, the two local signals having a 1/3 duty ratio and phases mutually shifted by a 1/2 period.

In one aspect of the present technology, two local signals having a 1/3 duty ratio and phases mutually shifted by a 1/2 period are mixed with each signal of a differential signal, and a difference between results of the mixing of the two local signals is calculated.

In another aspect of the present technology, two local signals to be mixed with a differential signal are generated, the two local signals having a 1/3 duty ratio and phases mutually shifted by a 1/2 period.

Advantageous Effects of Invention

According to the present technology, it is possible to process a signal. Further, according to the present technology, it is possible to increase a harmonic rejection ratio while suppressing an increase in power consumption.

MODE(S) FOR CARRYING OUT THE INVENTION

Hereinafter, modes for carrying out the present disclosure (hereinafter, referred to as embodiments) will be described. It should be noted that description will be given in the following order.

1. Frequency Conversion of Signal
2. First Embodiment (Frequency Conversion Apparatus)
3. Second Embodiment (Frequency Conversion Apparatus)
4. Third Embodiment (Local Signal Generation Section)
5. Fourth Embodiment (Local Signal Generation Section)
6. Fifth Embodiment (Frequency Conversion Apparatus)

<1. Frequency Conversion of Signal>
<Frequency Conversion Using Mixer>

In signal processing, frequency conversion for converting a frequency of a signal to be processed into a desired frequency may be performed. For example, mixing a received signal (RF signal) with a local signal (LO signal) having a different frequency to down-convert the frequency into an intermediate frequency (conversion into IF signal) is generally performed in a receiver.

Figure 1:
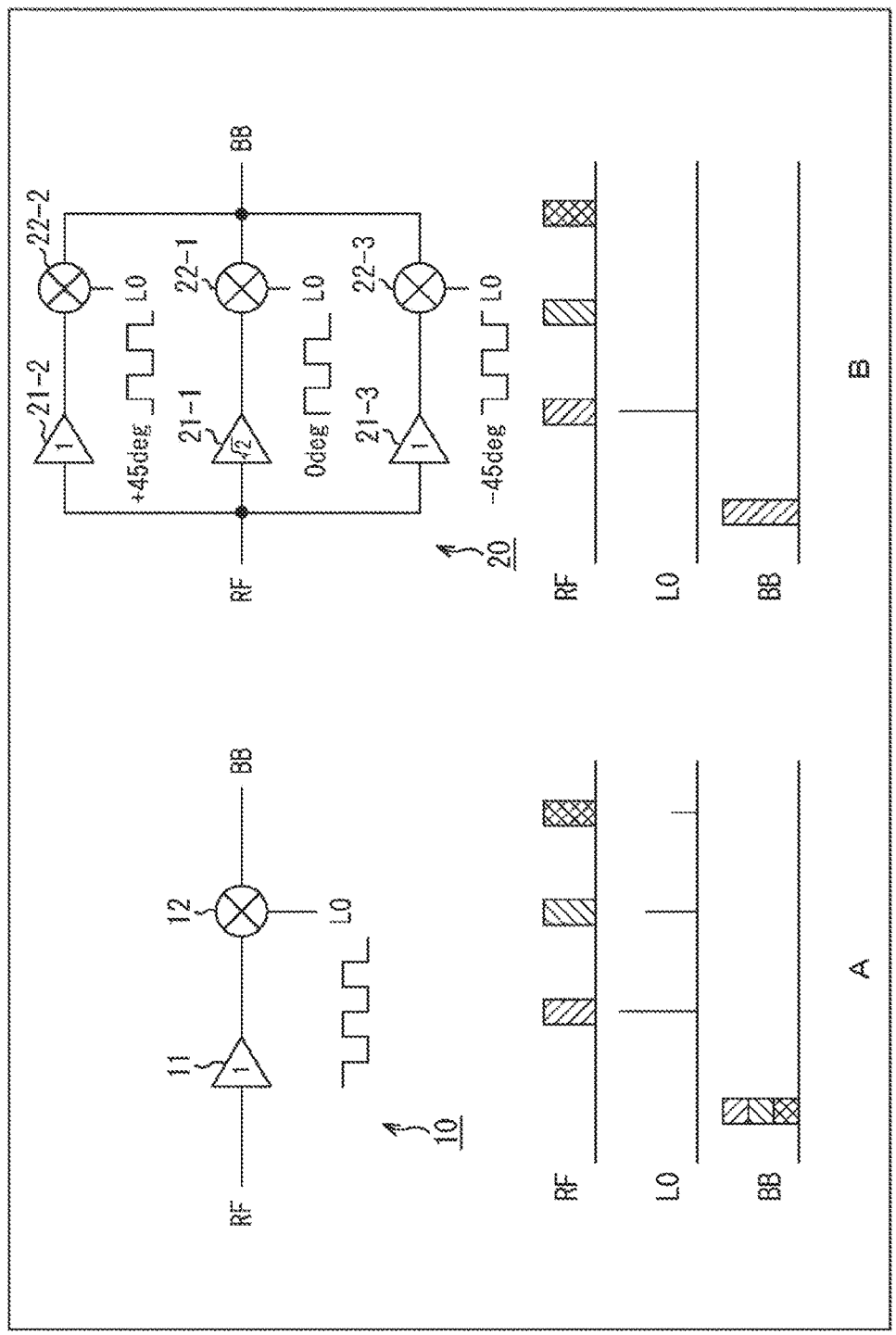
FIG. 1 is a diagram of an example showing how frequency conversion is performed.

For example, a frequency conversion apparatus shown in part A of FIG. 1 includes an amplification section 11 and a mixer 12, and amplifies an input RF signal in the amplification section 11, mixes the amplified RF signal with an LO signal having a different frequency in the mixer 12, and outputs a BB signal having a desired frequency (baseband frequency).

In the case of the frequency conversion apparatus 10 having such a configuration, as shown in the lower side of FIG. 1, an LO signal having a square wave in which a duty ratio is 50% contains a harmonic component whose frequency is an odd multiple (3, 5, 7 . . . ) of the frequency of the LO signal. Thus, there has been a risk that not only an RF signal at a frequency of a desired LO signal but also an originally-unnecessary RF signal at an odd multiple of the frequency of the LO signal are down-converted into signals having the same baseband frequency and included in the BB signal.

For example, a signal of a WLAN (Wireless Local Area Network) of 2.4 GHz has just a threefold frequency with respect to an RF signal of a television (TV) signal of 800 MHz. Therefore, in a case where this signal of the WLAN is significantly large, there has been a risk that this signal of the WLAN is included in the IF signal in a receiver for the television signal (TV RF signal).

<Harmonic Rejection Mixer>

In this regard, as in a frequency conversion apparatus 20 shown in part B of FIG. 1, there has been conceived a method of adding three signal paths in which a gain and a phase of an LO signal are shifted, to suppress downconversion of RF signals having threefold and fivefold frequencies of that of the LO signal. The frequency conversion apparatus 20 (harmonic rejection mixer) includes a path constituted of an amplification section 21-1 and a mixer 22-1, a path constituted of an amplification section 21-2 and a mixer 22-2, and a path constituted of an amplification section 21-3 and a mixer 22-3. The amplification section 21-1 amplifies an RF signal by √2 times, and the mixer 22-1 mixes an LO signal. The amplification section 21-2 amplifies the RF signal onefold, and the mixer 22-2 mixes an LO signal having a phase shifted by +45 degrees with respect to the LO signal mixed in the mixer 22-1. The amplification section 21-3 amplifies the RF signal onefold, and the mixer 22-3 mixes an LO signal having a phase shifted by −45 degrees with respect to the LO signal mixed in the mixer 22-1.

It should be noted that the amplification section 21-1 to the amplification section 21-3 are referred to as amplification section(s) 21 unless otherwise distinguished from one another. Further, the mixer 22-1 to the mixer 22-3 are referred to as mixer(s) 22 unless otherwise distinguished from one another.

Figure 2:
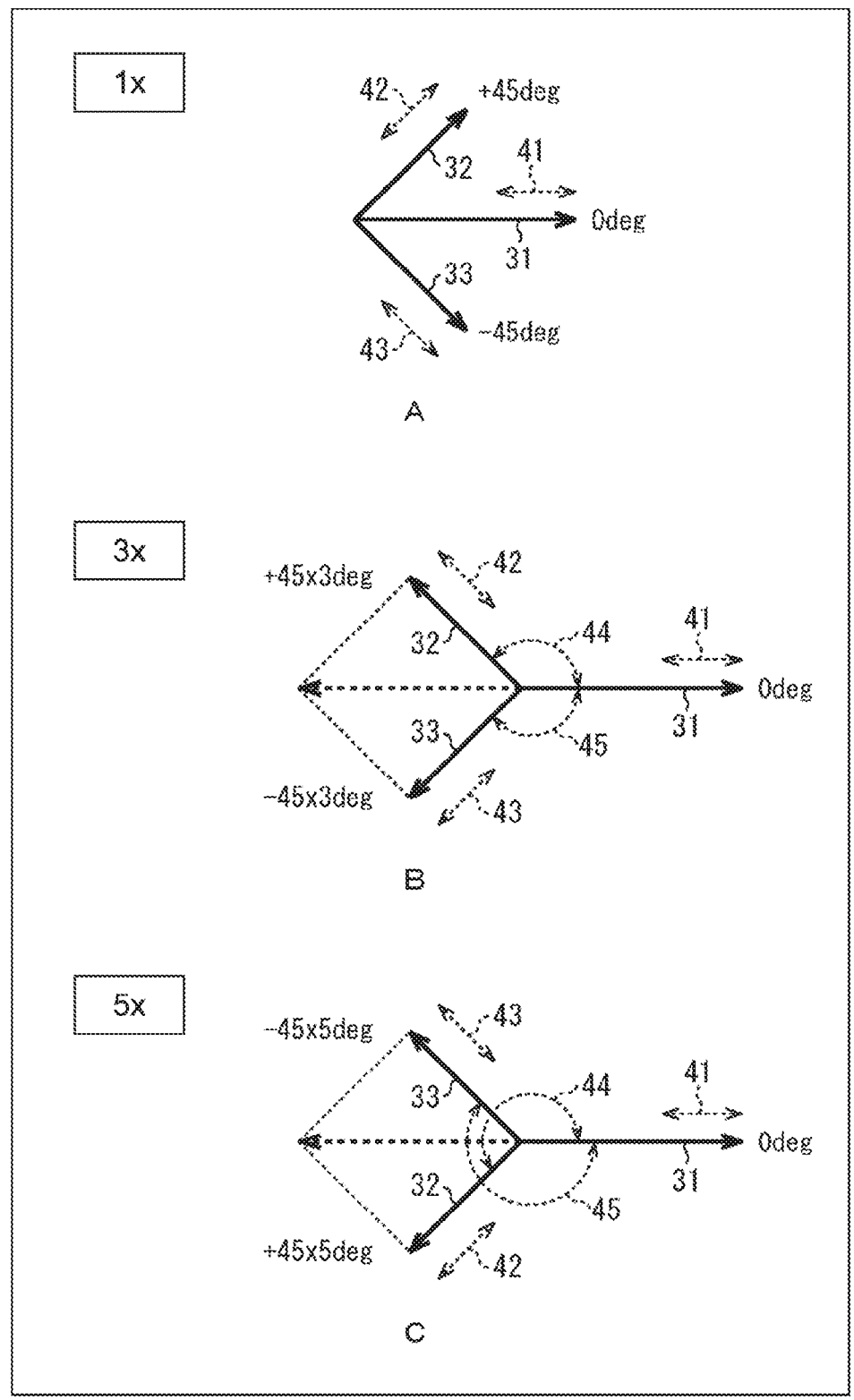
FIG. 2 is a diagram of an example showing how an unnecessary frequency component is suppressed.

In such a case, for a frequency component having a onefold frequency of that of the LO signal, which is included in the RF signal, vectors such as a vector 31 to a vector 33 shown in part A of FIG. 2 are added. The vector 31 represents a BB signal generated by the path constituted of the amplification section 21-1 and the mixer 22-1. The vector 32 represents a BB signal generated by the path constituted of the amplification section 21-2 and the mixer 22-2. The vector 33 represents a BB signal generated by the path constituted of the amplification section 21-3 and the mixer 22-3. Therefore, the frequency component having a onefold frequency of that of the LO signal, which is included in the RF signal, is not cancelled out between the signals of the respective paths and is included in the BB signal.

In contrast to this, for a frequency component having a threefold frequency of that of the LO signal, which is included in the RF signal, vectors such as a vector 31 to a vector 33 shown in part B of FIG. 2 are added. Therefore, the frequency component having a threefold frequency of that of the LO signal, which is included in the RF signal, is cancelled out between the signals of the respective paths and is not included in the BB signal. Ideally, this frequency component can be completely removed from the BB signal.

Similarly, for a frequency component having a fivefold frequency of that of the LO signal, which is included in the RF signal, vectors such as a vector 31 to a vector 33 shown in part C FIG. 2 are added. Therefore, the frequency component having a fivefold frequency of that of the LO signal, which is included an the RF signal, is cancelled out between the signals of the respective paths and is not included in the BB signal. Ideally, this frequency component can be completely removed from the BB signal.

<Mathematical Expressions>

Fourier transform of a square wave in which the amplitude is 1 and the duty ratio (duty) is d can be expressed as Expression (1).

$$f(t) = d + \sum_{n=1}^{\infty} \frac{2}{n\pi} \cdot \sin(n\pi d) \cdot \cos(n\omega t) \quad (1)$$

As in the frequency conversion apparatus 20 (harmonic rejection mixer) shown in part B of FIG. 1, signals of the square wave in which the gain and the phase are shifted (i.e., the signals of the respective paths) $f_1(t)$, $f_2(t)$, and $f_3(t)$ can be expressed as Expression (2) to Expression (4).

$$f_1(t) = d + \sum_{n=1}^{\infty} \frac{2}{n\pi} \cdot \sin(n\pi d) \cdot \cos\left(n\left(\omega t - \frac{\pi}{4}\right)\right) \quad (2)$$

$$f_2(t) = \sqrt{2} \cdot \left(d + \sum_{n=1}^{\infty} \frac{2}{n\pi} \cdot \sin(n\pi d) \cdot \cos(n\omega t)\right) \quad (3)$$

$$f_3(t) = d + \sum_{n=1}^{\infty} \frac{2}{n\pi} \cdot \sin(n\pi d) \cdot \cos\left(n\left(\omega t + \frac{\pi}{4}\right)\right) \quad (4)$$

In a case where the duty ratio is 0.5 (d=0.5 (Duty=50%)), as shown in Expression (5) to Expression (7), it is found that the frequency components having threefold and fivefold frequencies of that of the LO signal become zero.

$$H_1 = f_1(t) + f_2(t) + f_3(t)|_{1st\ harmonics} \quad (5)$$
$$= \frac{2}{\pi} \cdot \sin(\pi d) \cdot \left(\cos\left(\omega t - \frac{\pi}{4}\right) + \sqrt{2}\cos(\omega t) + \cos\left(\omega t + \frac{\pi}{4}\right)\right)$$
$$= \frac{2}{\pi} \cdot \sin(\pi d) \cdot 2\sqrt{2} \cdot \cos(\omega t)$$

$$H_2 = f_1(t) + f_2(t) + f_3(t)|_{3rd\ harmonics} \quad (6)$$
$$= \frac{2}{3\pi} \cdot \sin(3\pi d) \cdot \left(\cos\left(3\omega t - \frac{3\pi}{4}\right) + \sqrt{2}\cos(3\omega t) + \cos\left(3\omega t + \frac{3\pi}{4}\right)\right)$$
$$= \frac{2}{3\pi} \cdot \sin(3\pi d) \cdot 0 \cdot \cos(3\omega t) = 0$$

$$H_3 = f_1(t) + f_2(t) + f_3(t)|_{5th\ harmonics} \quad (7)$$
$$= \frac{2}{5\pi} \cdot \sin(5\pi d) \cdot \left(\cos\left(5\omega t - \frac{5\pi}{4}\right) + \sqrt{2}\cos(5\omega t) + \cos\left(5\omega t + \frac{5\pi}{4}\right)\right)$$
$$= \frac{2}{5\pi} \cdot \sin(5\pi d) \cdot 0 \cdot \cos(5\omega t) = 0$$

Figure 3:
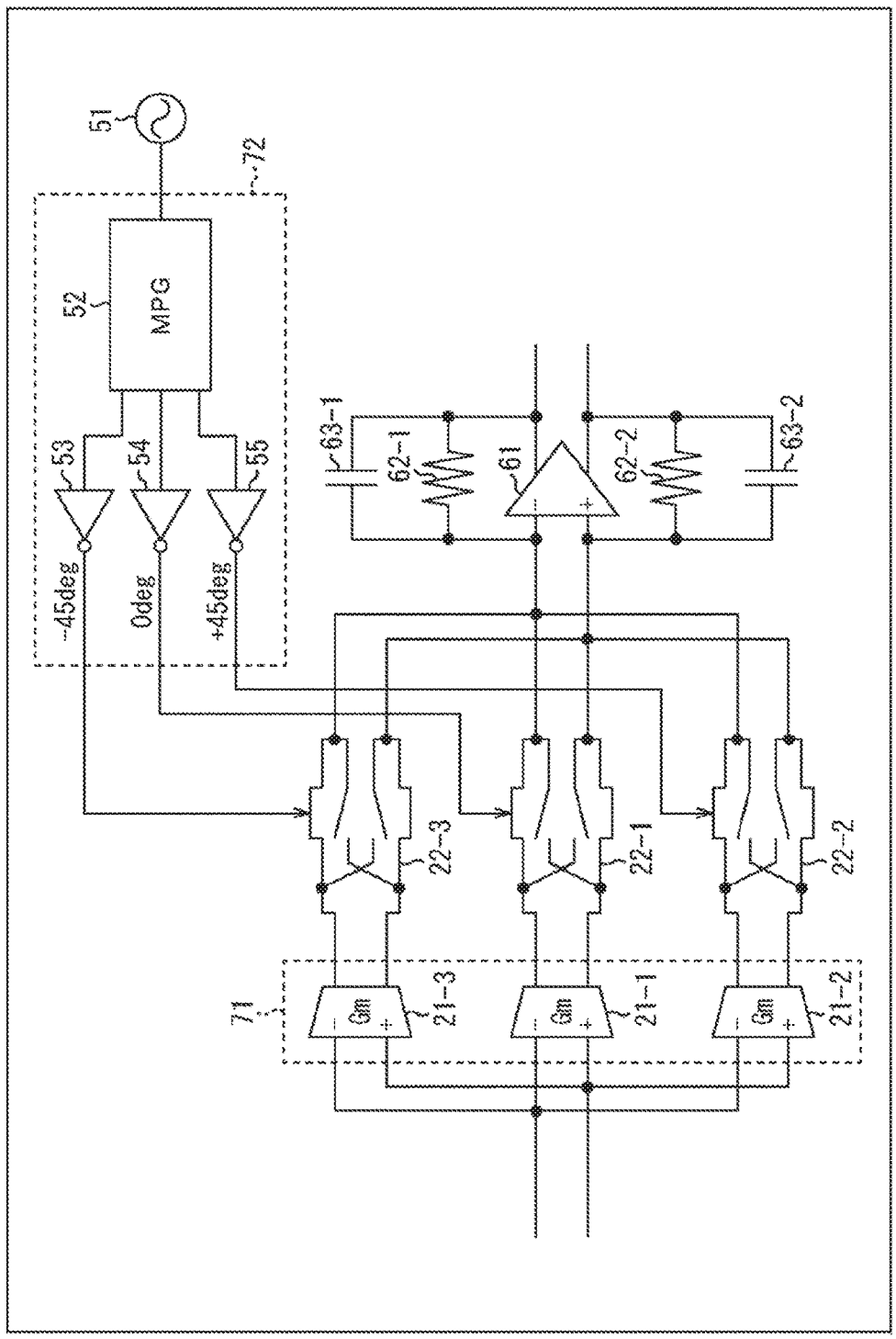
FIG. 3 is a diagram showing a circuit example of a mixer.

FIG. 3 shows a circuit example of the frequency conversion apparatus 20 (harmonic rejection mixer) in more details. As shown in FIG. 3, the LO signals of the respective paths (LO signals having phase shifts of 0 degrees, +45 degrees, −45 degrees) are generated by an LO signal generation section 52 using a signal generated in an oscillator 51 and are supplied to the mixer 22-1 to the mixer 22-3 via an inverter 53 to an inverter 55.

A differential signal that is output from the mixer 22 is amplified in a differential amplification. section 61 for output. A resistor 62-1, a resistor 62-2, a capacitor 63-1, and a capacitor 63-2 are connected in parallel to the differential amplification section 61. It should be noted that the resistor 62-1 and the resistor 62-2 are referred to as resistor (s) 62 unless otherwise distinguished from one another. Further, the capacitor 63-1 and the capacitor 63-2 are referred to as capacitor(s) 63 unless otherwise distinguished from one another.

As described above, the frequency conversion apparatus 20 (harmonic rejection mixer) is constituted of many circuits, but since the circuits vary from one another (have variations in circuit), the addition of vectors as shown in FIG. 2 cannot be performed ideally. In other words, there has been a risk that the frequency components, of the RF signal, having the threefold or fivefold frequency of that of the LO signal cannot be completely cancelled out and an unintended frequency component is down-converted.

The harmonic rejection ratio (HRR) is a ratio of a down-conversion component from an original desired LO signal frequency to a down-conversion component from a threefold or fivefold frequency of an unintended LO signal frequency. A greater value of the harmonic rejection ratio (HRR) is better.

<Suppression of Variations and Slew Rate>

In other words, the harmonic rejection ratio is affected by the variations in circuit. The variations in circuit include a gain component (that is a portion surrounded by a dotted line 71 of FIG. 4) and a phase component (that is a portion surrounded by a dotted line 72 of FIG. 3). Since one period (T) becomes short at a particularly high frequency, a phase component (variations in phase) ($2n*t/T$) is largely affected even by fixed time variations (t).

Therefore, in order to reduce the variations in phase, attention needs to be paid to designing of a logic circuit in the portion surrounded by the dotted line 72 of FIG. 3. The variations in phase can be estimated by dividing a shift in threshold of a logic transistor (Logic Tr) by a slew rate. In order to reduce the variations in phase, it is necessary to increase a slew rate.

Figure 4:
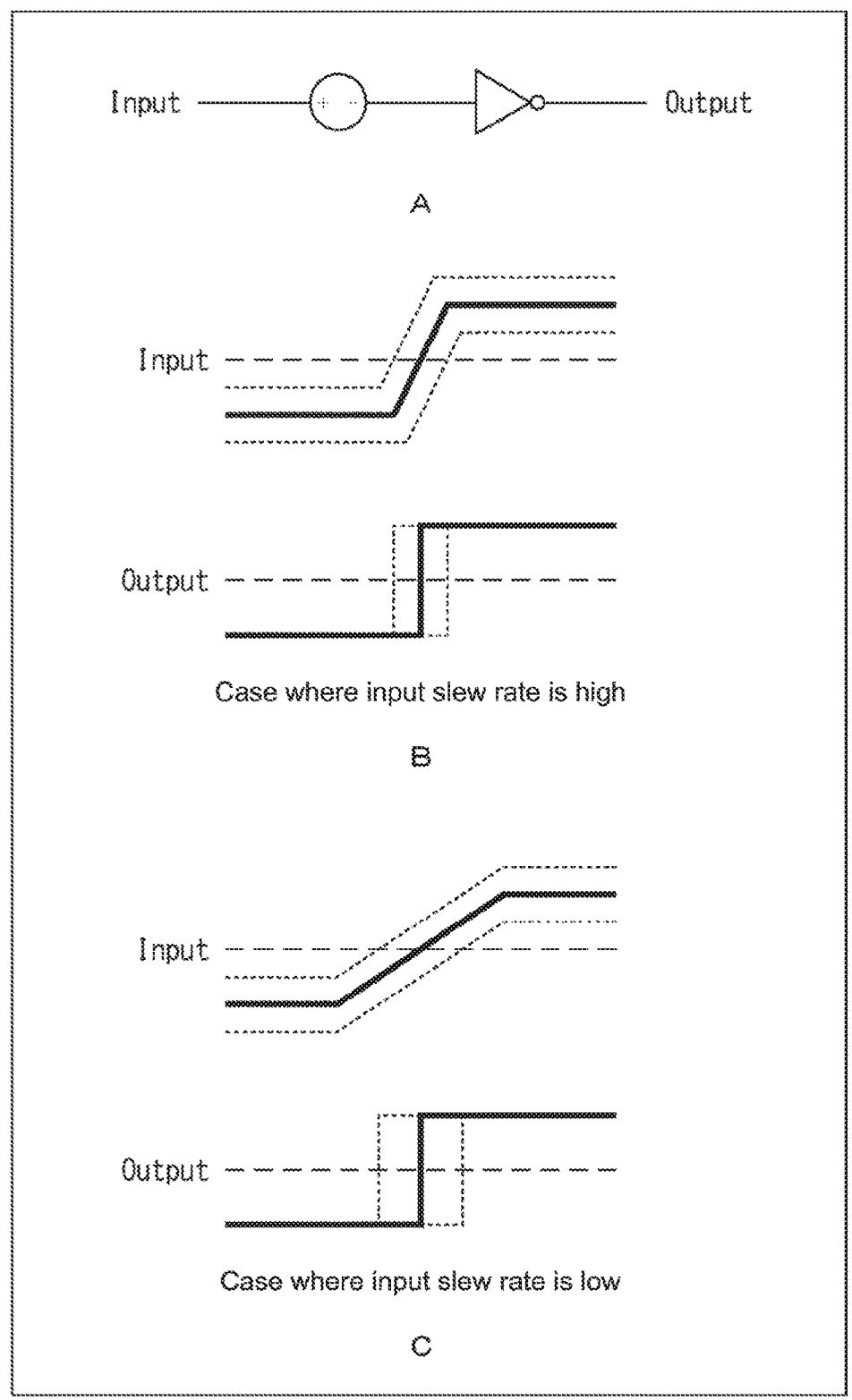
FIG. 4 is a diagram for describing a relationship between a phase shift and a slew rate.

For example, assuming that an edge of an input signal is caused to rise by a circuit as shown in part A of FIG. 4, variations in phase at the time of output, which are due to variations in phase at the time of input as indicated by dotted lines, are made smaller (the width between the dotted lines is narrower) in the case of a high slew rate (part B of FIG. 4) than in the case of a low slew rate (part C of FIG. 4).

However, increasing the slew rate has needed a large current, and there has been a risk that power consumption is increased.

<Resonator Mixer>

Figure 5:
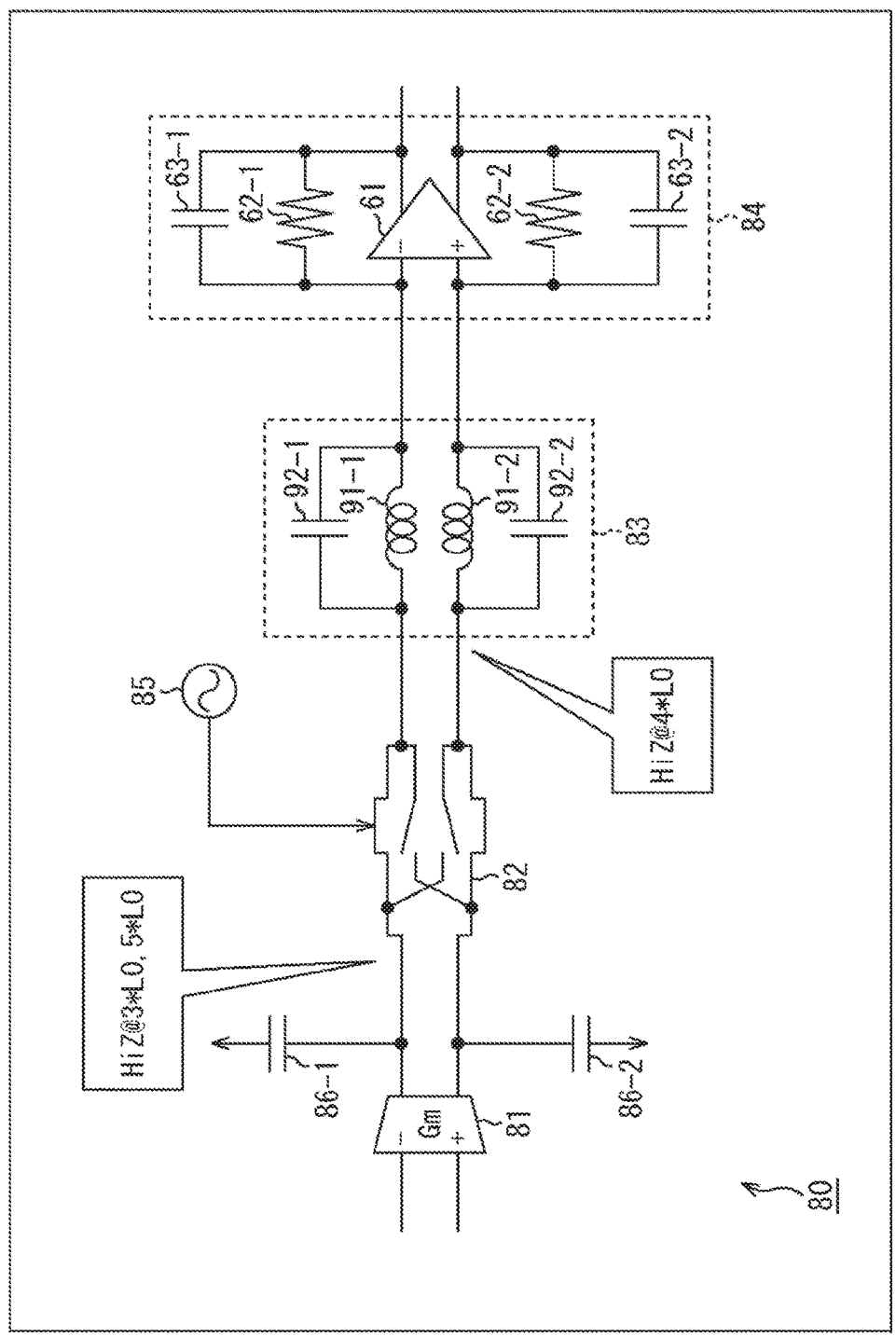
FIG. 5 is a diagram showing a configuration example of a resonator mixer.

For example, a resonator mixer as described in Non-Patent Literature 1 has been conceived as a method of increasing a harmonic rejection ratio without increasing power consumption. FIG. 5 shows a main configuration example of the resonator mixer.

As shown in FIG. 5, a resonator mixer 80 includes a voltage/current conversion section 81, a mixing section 82, a parallel LC resonator 83, an amplification section 84, an LO signal generation section 85, a capacitor 86-1, and a capacitor 86-2.

The voltage/current conversion section 81 outputs a differential signal of a current corresponding to a voltage of an input differential signal at a mutual conductance Gm. The voltage/current conversion section 81 is a circuit similar to the amplification section 21 of FIG. 3.

The mixing section 82 mixes the differential signal, which is output from the voltage/current conversion section 81, with LO signals generated in the LO signal generation section 85, and outputs a result of the mixing. The mixing section 82 is a circuit similar to the mixer 22 of FIG. 3.

The parallel LC resonator 83 resonates with the differential signal, which is output from the mixing section 82, at a fourfold frequency of the frequency of the LO signal. The parallel LC resonator 83 includes an inductor 91-1, an inductor 91-2, a capacitor 92-1, and a capacitor 92-2 that are connected in parallel. It should be noted that the inductor 91-1 and the inductor 91-2 are referred to as inductor(s) 91 unless otherwise distinguished from one another. Further, the capacitor 92-1 and the capacitor 92-2 are referred to as capacitor(s) 92 unless otherwise distinguished from one another.

The amplification section 84 amplifies the differential signal, which is output from the parallel LC resonator 83, and outputs the resultant signal. As in the case of FIG. 3, the amplification section 84 includes the differential amplification section 61, the resistors 62, and the capacitors 63 that are mutually connected in parallel.

The LO signal generation section 85 generates an LO signal to be mixed with the differential signal and supplies the LO signal to the mixing section 82.

The capacitor 86-1 and the capacitor 86-2 are provided between each output of the voltage/current conversion section 81 and the ground potential. It should be noted that the capacitor 86-1 and the capacitor 86-2 are referred to as capacitor(s) 86 unless otherwise distinguished from one another.

The parallel LC resonator 83 resonates at a fourfold frequency of the frequency of the LO signal. Thus, by impedance frequency conversion of the mixing section 82, impedance becomes significantly large at threefold ($4*fLO-fLO$; fLO is a frequency of the LO signal) and fivefold ($4*fLO+fLO$) frequencies of the frequency of the LO signal when seen from the input side of the mixing section 82. For that reason, those frequency components drain from the output of the voltage/current conversion section 81 to the ground potential via the capacitors 86. As a result, even with one signal path, a down-conversion component from the threefold and fivefold frequencies of the LO signal frequency can be made small.

However, in reality, this resonator mixer 80 has had difficulty of ensuring the harmonic rejection ratio of 20 dB or more. This is because, as the capacitance of the capacitor 86 is made larger, a down-conversion component from the threefold and fivefold frequencies of the LO signal frequency is made smaller, but at the same time, a down-conversion gain of the desired LO signal frequency is also made small. For that reason, it has been impossible to indefinitely increase the capacitance of the capacitor 86 and difficult to sufficiently increase the harmonic rejection ratio. For example, in the case of a silicon tuner, which needs a harmonic rejection ratio of about 40 dB, it has been difficult to obtain a sufficient harmonic rejection ratio with use of the resonator mixer 80.

<Local Signal Having 1/3 Duty Ratio and Mixing Section Having Differential Configuration>

In this regard, two local signals having a 1/3 duty ratio and phases mutually shifted by a 1/2 period are mixed with each signal of the differential signal, and a difference between the results of the mixing of the two local signals is calculated.

For example, a signal processing apparatus includes a mixing section having a differential configuration in which two local signals having a 1/3 duty ratio and phases mutually shifted by a 1/2 period are mixed with each signal of the differential signal, and a difference between the results of the mixing of the two local signals is calculated.

With this configuration, down-conversion of frequency components, of the input signal, having twofold to fourfold frequencies of that of the local signal can be suppressed without increasing power consumption. In other words, frequency conversion can be performed such that an increase in power consumption and unnecessary frequency components in a converted signal are more suppressed. Accordingly, a signal in which a frequency component having a frequency other than a desired frequency is more suppressed can be obtained. In other words, it is possible to increase the harmonic rejection ratio while suppressing an increase in power consumption.

It should be noted that the signal processing apparatus may further include a local signal generation section that generates two local signals having a 1/3 duty ratio and phases mutually shifted by a 1/2 period, and the mixing section may mix the local signals generated by the local signal generation section with the differential signal.

<2. First Embodiment>
<Frequency Conversion Apparatus>

From Expression (1) described above, assuming that the duty ratio d=0.5 (50%) and an amplitude ratio (harmonic rejection ratio) of a k-fold frequency (n=k) of that of a reference wave (n=1) is HRR_k, HRR_2=∞, HRR_3=9.54 dB, HRR_4=∞, HRR_5=13.98 dB, HRR_6=∞, and HRR_7=16.9 dB. Therefore, when the duty ratio (duty) is set to 50%, an even-ordered component becomes substantially zero. Further, when the duty ratio d=1/3 (33.33 . . . %), HRR_2=6.02 dB, HRR_3=∞, HRR_4=12.04 dB, HRR_5=13.98 dB, HRR_6=∞, and HRR_7 =16.9 dB, and a frequency component having a threefold frequency of that of the reference wave becomes substantially zero.

Figure 6:
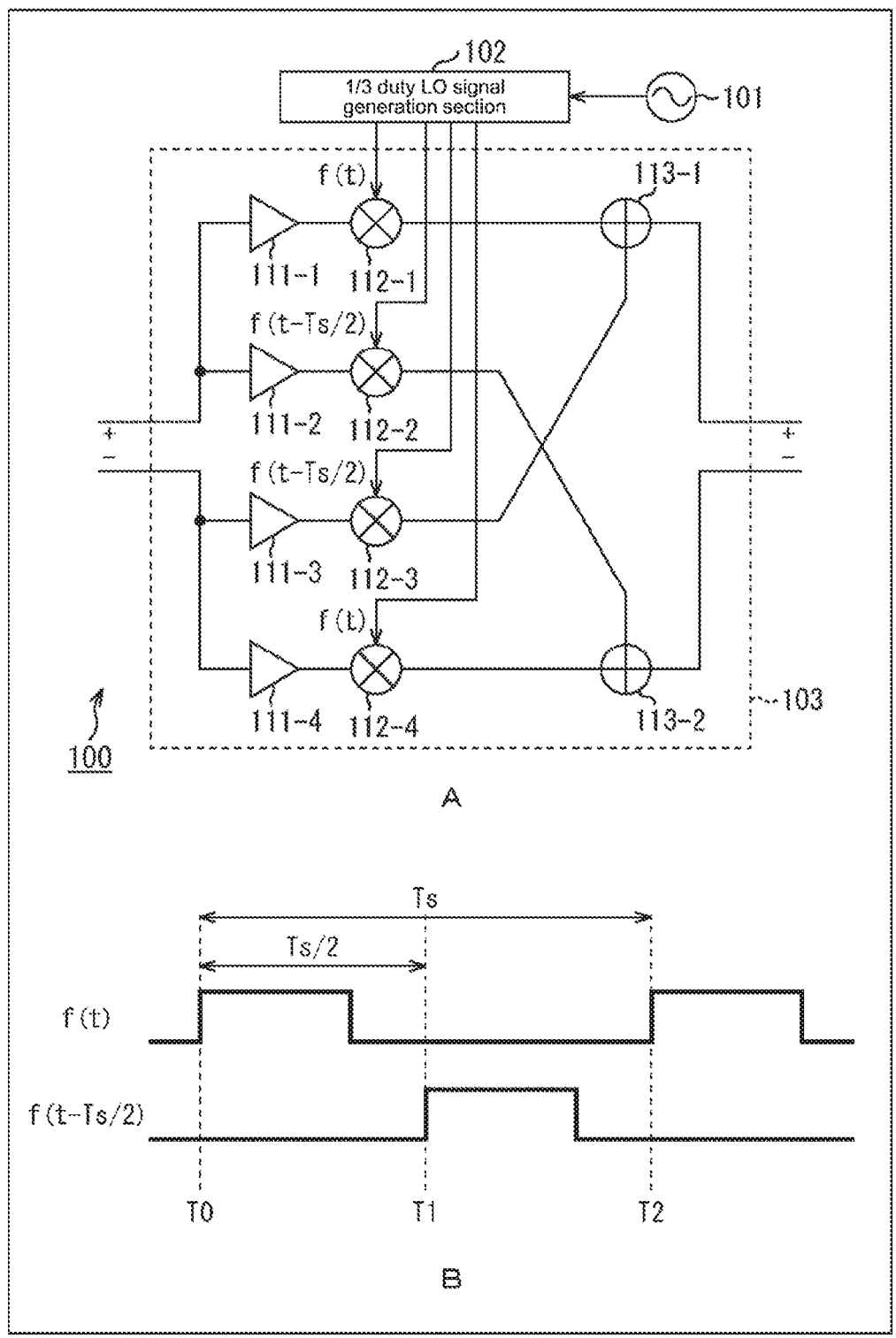
FIG. 6 is a diagram showing a main configuration example of a frequency conversion apparatus.

That is, by combination of those above as shown in the example of FIG. 6, ideally, HRR_2 to HRR_4 (more precisely, HRR_6. HRR_8, . . . etc. as well) can be changed to HRR=∞ as shown in Expression (8) and Expression (9).

$$f\left(t - \frac{T_s}{2}\right) = f\left(t - \frac{\pi}{\omega}\right) = d + \sum_{n=1}^{\infty} \frac{2}{n\pi} \cdot \sin(n\pi d) \cdot \cos\left(n\omega\left(t - \frac{\pi}{\omega}\right)\right) \quad (8)$$

$$= d + \sum_{n=1}^{\infty} \frac{2}{n\pi} \cdot \sin(n\pi d) \cdot \cos(n\omega t - n\pi)$$

$$f(t) - f\left(t - \frac{T_s}{2}\right) = \sum_{n=1}^{\infty} \frac{2}{n\pi} \cdot \sin(n\pi d) \cdot (\cos(n\omega t) - \cos(n\omega t - n\pi)) \quad (9)$$

Part A of FIG. 6 shows a main configuration example of a frequency conversion apparatus that is one embodiment of the signal processing apparatus as described above. A frequency conversion apparatus 100 shown in part A of FIG. 6 is an apparatus that converts a frequency of an input differential signal. The frequency conversion apparatus 100 mixes two local signals having a 1/3 duty ratio and phases mutually shifted by a 1/2 period with each signal of the differential signal and calculates a difference between results of the mixing of the two local signals. The frequency conversion apparatus 100 includes an oscillation section 101, a 1/3 duty LO signal generation section 102, and a mixing section 103.

The oscillation section 101 generates a clock signal having a desired frequency and supplies the clock signal to the 1/3 duty LO signal generation section 102. For example, the oscillation section 101 generates a clock signal having a sixfold frequency of that of a local signal (LO signal) supplied to the mixing section 103.

The 1/3 duty LO signal generation section 102 generates two local signals (LO signals) having a 1/3 duty ratio and phases mutually shifted by a 1/2 period by using the clock signal supplied from the oscillation section 101. The frequencies of those local signals are optional. However, the frequencies of the respective local signals are identical to each other. Part B of FIG. 6 shows waveform examples of those local signals. As shown in part B of FIG. 6, two local signals (f(t), f(t−Ts/2)) generated by the 1/3 duty LO signal generation section 102 have the duty ratio of 1/3 and the phases mutually shifted by a 1/2 period (Ts/2). The 1/3 duty LO signal generation section 102 supplies the generated local signals to the mixing section 103.

The mixing section 103 mixes the local signals, which are supplied from the 1/3 duty LO signal generation section 102, with as input signal. The mixing section 103 forms a differential configuration, and mixes the two local signals (f(t), f(t−Ts/2)), which are supplied from the 1/3 duty LO signal generation section 102, with each signal of the input. differential signal and calculates a difference between results of the mixing of those signals (Expression (9)). The mixing section 103 outputs a differential signal as a result of the calculation.

The mixing section 103 includes an amplification section 111-1 to an amplification section 111-4, a switch section 112-1 to a switch section 112-4, a computing section 113-1, and a computing section 113-2 that are disposed as shown in part A of FIG. 6. It should be noted that hereinafter the amplification section 111-1 to the amplification section 111-4 are referred to as amplification section(s) 111 unless otherwise distinguished from one another. Further, the switch section 112-1 to the switch section 112-4 are referred to as switch section(s) 112 unless otherwise distinguished from one another. Furthermore, the computing section 113-1 and the computing section 113-2 are referred to as computing section (s) 113 unless otherwise distinguished from one another.

The amplification section 111 amplifies the input differential signal and supplies the input differential signal to the switch section 112. The switch section 112 enables/disables connection of the input and the output on the basis of the local signal supplied from the 1/3 duty LO signal generation section 102, to mix the signal supplied from the amplification section 111 with the local signal. The switch section 112-1 mixes a positive-side signal of the differential signal amplified in the amplification section 111-1 with the local signal f(t) and supplies a signal as a result of the mixing to the computing section 113-1. The switch section 112-2 mixes the positive-side signal of the differential signal amplified in the amplification section 111-2 with the local signal f(t−Ts/2) and supplies a signal as a result of the mixing to the computing section 113-2. The switch section 112-3 mixes a negative-side signal of the differential signal amplified in the amplification section 111-3 with the local signal f(t−Ts/2) and supplies a signal as a result of the mixing to the computing section 113-1. The switch section 112-4 mixes the negative-side signal of the differential signal amplified in the amplification section 111-4 with the local signal f(t) and supplies a signal as a result of the mixing to the computing section 113-2.

The computing section 113 combines the two signals, which are supplied from the switch sections 112, and outputs a signal as a result of the combination. The positive/negative of the two signals supplied to the computing section 113 are opposite to each other (correspond to the mutually opposite signals of the differential signal). Thus, computing for synthesizing both the signals is expressed by subtraction of the local signal f(t−Ts/2) from the local signal f(t), as shown in Expression (9).

The computing section 113-1 combines the signal supplied from the switch section 112-1 and the signal supplied from the switch section 112-3 and outputs a signal as a result of the combination, which serves as a positive-side signal of a differential signal (IF signal) after subjected to frequency conversion. In other words, the computing section 113-1 outputs a difference between the signal supplied from the switch section 112-1 and the signal supplied from the switch section 112-3. The computing section 113-2 combines the signal supplied from the switch section 112-2 and the signal supplied from the switch section 112-4 and outputs a signal as a result of the comb nation, which serves as a negative-side signal of the differential signal (IF signal) after subjected to frequency conversion. In other words, the computing section 113-2 outputs a difference between the signal supplied from the switch section 112-2 and the signal supplied from the switch section 112-4.

With this configuration, the frequency conversion apparatus 100 can increase the harmonic rejection ratio while suppressing an increase in power consumption, as described above using Expression (8) and Expression (9).

<3. Second Embodiment>

<Frequency Conversion Apparatus>

Figure 7:
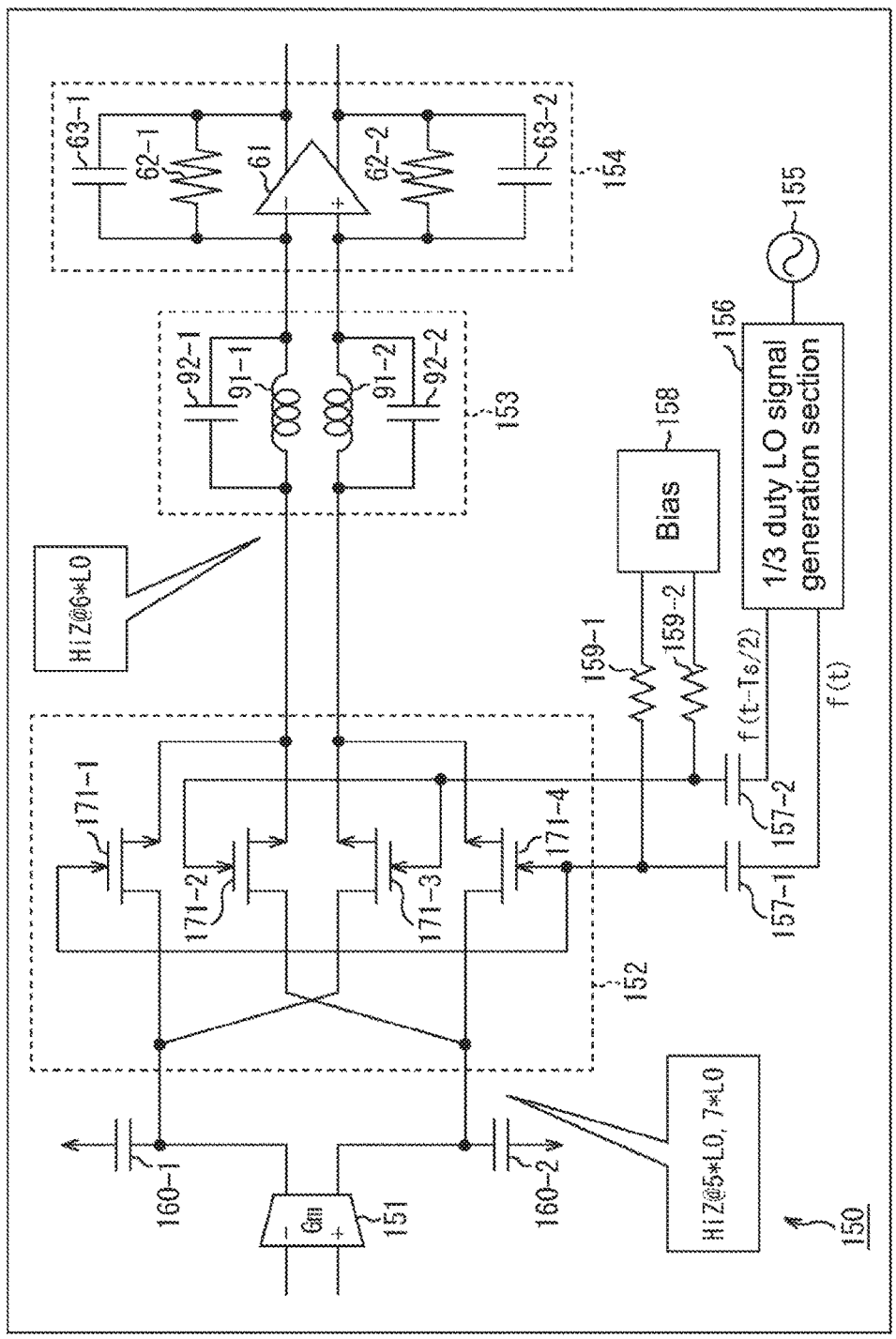
FIG. 7 is a diagram showing a main configuration example of a frequency conversion apparatus.

The configuration of the frequency conversion apparatus to which the present technology is applied is not limited to the example of FIG. 6 and may be applied to a resonator mixer as shown in FIG. 7, for example.

In other words, a resonance section may be provided, which resonates with a differential signal, with which a local signal is mixed by the mixing section, at a predetermined resonant frequency. The resonance section may resonate at a sixfold frequency of that of the local signal. It should be noted that the configuration of the resonance section is optional, but the resonance section may include a parallel LC circuit, for example. Further, the resonant frequency of the resonance section may be variable.

Further, a voltage/current conversion section may be provided, which converts a voltage into a current with respect to the differential signal. The mixing section may mix the differential signal output from the voltage/current conversion section with a local signal. Further, a capacitor may further be provided between an output of the voltage/current conversion section and the ground potential.

Further, a differential amplification section may be provided, which amplifies the differential signal mixed with the local signal by the mixing section.

Furthermore, a local signal generation section that generates a local signal may be provided. The mixing section may mix the differential signal with the local signal generated by the local signal generation section.

<Configuration>

A frequency conversion apparatus 150 shown in FIG. 7 is an apparatus that converts a frequency of an input differential signal as in the case of the frequency conversion apparatus 100 shown in part A of FIG. 6. In other words, the frequency conversion apparatus 150 mixes two local signals having a 1/3 duty ratio and phases mutually shifted by a 1/2 period with each signal of the differential signal and calculates a difference between results of the mixing of the two local signals. As shown in FIG. 7, the frequency conversion apparatus 150 includes a voltage/current conversion section 151, a mixing section 152, a resonance section 153, an amplification section 154, an oscillation section 155, a 1/3 duty LO signal generation section 156, a capacitor 157-1, a capacitor 157-2, a bias application section 158, a resistor 159-1, a resistor 159-2, a capacitor 160-1, and a capacitor 160-2.

The voltage/current conversion section 151 outputs a differential signal of a current corresponding to a voltage of an input differential signal at a mutual conductance Gm. The voltage/current conversion section 151 is a circuit similar to the voltage/current conversion section 81 of FIG. 5.

The mixing section 152 mixes the differential signal, which is output from the voltage/current conversion section 151, with local signals (LO signals) generated in the 1/3 duty LO signal generation section 156, and outputs a result of the mixing as a differential signal subjected to the frequency conversion.

The resonance section 153 resonates with the differential signal, which is output from the mixing section 152, at a predetermined frequency. The resonance section 153 is a circuit similar to the parallel IC resonator 83 of FIG. 5. In other words, the resonance section 153 includes the inductors 91 and the capacitors 92 that are connected in parallel The amplification section 154 amplifies the differential signal output from the resonance section 153 and then outputs the differential signal. The amplification section 154 is a circuit similar to the amplification section 84 of FIG. 5. In other words, the amplification section 154 includes the differential amplification section 61, the resistors 62, and the capacitors 63 that are connected in parallel.

The oscillation section 155 generates a clock signal having a desired frequency and supplies the clock signal to the 1/3 duty LO signal generation section 156. The oscillation section 155 is a circuit similar to the oscillation section 101 of FIG. 6. For example, the oscillation section 155 generates a clock signal having a sixfold frequency of that of a local signal (LO signal) supplied to the mixing section 152, for example.

The 1/3 duty LO signal generation section 156 generates two local signals (LO signals) having a 1/3 duty ratio and phases mutually shifted by a 1/2 period by using the clock signal supplied from the oscillation section 155. The frequencies of those local signals are optional. However, the frequencies of the respective local signals are identical to each other. The 1/3 duty LO signal generation section 156 is a processing section similar to the 1/3 duty LO signal generation section 102 of FIG. 6. The 1/3 duty LO signal generation section 156 supplies the generated local signals to the mixing section 152 via the capacitor 157-1 and the capacitor 157-2. The capacitor 157-1 and the capacitor 157-2 are referred to as capacitor(s) 157 unless otherwise distinguished from one another.

The bias application section 158 applies a predetermined bias to the mixing section 152 via the resistor 159-1 and the resistor 159-2. The resistor 159-1 and the resistor 159-2 are referred to as resistor(s) 159 unless otherwise distinguished from one another.

The capacitor 160-1 and the capacitor 160-2 are provided between each output of the voltage/current conversion section 151 and the ground potential. It should be noted that the capacitor 160-1 and the capacitor 160-2 are referred to as capacitor(s) 160 unless otherwise distinguished from one another.

<Local Signal and Differential Configuration>

In the frequency conversion apparatus 150 having such a configuration, the 1/3 duty LO signal generation section 156 generates two local signals (f(t), f(t−Ts/2)) having a 1/3 duty ratio and phases mutually shifted by a 1/2 period, which have the waveforms as shown in part B of FIG. 6. The 1/3 duty LO signal generation section 156 then supplies the two local signals (f(t), f(t−Ts/2)) to the mixing section 152 via the capacitors 157. Accordingly, as described above, the following can be obtained: $HRR\_3=\infty$, and a frequency component having a threefold frequency of that of the reference wave becomes substantially zero.

Further, the mixing section 152 includes a switch 171-1 to a switch 171-4 that form a differential configuration as in the case of the mixing section 103 of FIG. 6. It should be noted that the switch 171-1 to the switch 171-4 are referred to as switch(es) 171 unless otherwise distinguished from one another. The switch 171 is constituted of, for example, a MOSFET (Metal Oxide Semiconductor Field Effect Transistor).

The switch 171 controls a current between the source and the drain on the basis of the local signal supplied to the gate (connects/disconnects between the source and the drain), to mix the signal supplied from the voltage/current conversion section 151 with the local signal.

For example, the switch 171-1 mixes a negative-side signal of the differential signal supplied from the voltage/current conversion section 151 with the local signal f(t) and outputs a signal as a result of the mixing, which serves as a negative-side signal of a differential signal after subjected to the frequency conversion, to the outside of the mixing section 152 (supplies a signal as a result of the mixing to (the inductor 91-1 and the capacitor 92-1 of) the resonance section 153). Further, for example, the switch 171-2 mixes a positive-side signal of the differential signal supplied from the voltage/current conversion section 151 with the local signal f(t−Ts/2) and outputs a signal as a result of the mixing, which serves as a negative-side signal of the differential signal after subjected to the frequency conversion, to the outside of the mixing section 152 (supplies a signal as a result of the mixing to (the inductor 91-1 and the capacitor 92-1 of) the resonance section 153).

In other words, the negative-side signal of the differential signal after subjected to the frequency conversion, which is output from the mixing section 152, is a combined signal of the signal output from the switch 171-1 and the signal output from the switch 171-2. The positive/negative of the signals to be mixed with the local signals in the switch 171-1 and the switch 171-2 are opposite to each other. Thus, the combined signal (i.e., the negative-side signal of the differential signal after subjected to the frequency conversion, which is output from the mixing section 152) can be expressed by subtraction as shown in Expression (9).

Further, for example, the switch 171-3 mixes the negative-side signal of the differential signal supplied from the voltage/current conversion section 151 with the local signal f(t−Ts/2) and outputs a signal as a result of the mixing, which serves as a positive-side signal of the differential signal after subjected to the frequency conversion, to the outside of the mixing section 152 (supplies a signal as a result of the mixing to (the inductor 91-2 and the capacitor 92-2 of) the resonance section 153). Further, for example, the switch 171-4 mixes the positive-side signal of the differential signal supplied from the voltage/current conversion section 151 with the local signal f(t) and outputs a signal as a result of the mixing, which serves as the positive-side signal of the differential signal after subjected to the frequency conversion, to the outside of the mixing section 152 (supplies a signal as a result of the mixing to (the inductor 91-2 and the capacitor 92-2 of) the resonance section 153).

In other words, the negative-side signal of the differential signal after subjected to the frequency conversion, which is output from the mixing section 152, is a combined signal of the signal output from the switch 171-3 and the signal output from the switch 171-4. The positive/negative of the signals to be mixed with the local signals in the switch 171-3 and the switch 171-4 are opposite to each other. Thus, the combined signal (i.e., the negative-side signal of the differential signal after subjected to the frequency conversion, which is output from the mixing section 152) can be expressed by subtraction as shown in Expression (9).

With this configuration, as in the case of the frequency conversion apparatus 100, the frequency conversion apparatus 150 can increase the harmonic rejection ratio while suppressing an increase in power consumption., as described above using Expression (8) and Expression (9).

It should be noted that FIG. 7 shows an example using the n-type MOSFET as the switch 171, but the present technology is not limited thereto and a p-type MOSFET may be used as the switch 171. In this case, the source and the drain of each switch 171 are connected inversely with the example of FIG. 7

<Resonant Frequency>

Here, in order to improve HRR_5 and HRR_7 (increase values), which are the amplitude ratios of the fivefold and sevenfold frequencies of that of the reference wave, the 1/3 duty LO signal generation section 156 generates a resonant frequency of the resonance section 153 and sets the resonant frequency to a sixfold frequency of that of the local signal (LO signal) supplied to the mixing section 152. With this setting, impedance becomes significantly large at fivefold (6*fLO−fLO; fLO is a frequency of the LO signal) and sevenfold (6*fLO+fLO) frequencies of the frequency of the LO signal when seen from the input side of the mixing section 152. For that reason, those frequency components drain from the output of the voltage/current conversion section 151 to the ground potential via the capacitors 160. As a result, even with one signal path, a down-conversion component from the fivefold and sevenfold frequencies of the LO signal frequency can be made small. In other words, HRR_5 and HRR_7 can be improved (the values can be increased).

A relationship between the resonant frequency, an inductor (L), and a capacitance (C) of the LC parallel resonator is expressed in Expression (10).

$$LC \text{ parallel resonant frequency} = \frac{1}{2\pi\sqrt{LC}} \qquad (10)$$

As described above, since the resonance section 153 resonates at a sixfold frequency of the frequency of the local signal, if the value of the capacitance is constant, the size of the inductor 91 can be reduced from Expression (10). This can suppress an increase in circuit size of the frequency conversion apparatus 150, and can also lower the degree of difficulty of designing and suppress an increase in cost.

It should be noted that, since an effect of the resonator mixer is about 20 dB as described above, it seems that the performance is slightly insufficient for achieving the value of 40 dB by HRR_5. However, in the frequency component having a fivefold or sevenfold frequency of the local signal frequency, an effect of a band-pass filter that is generally provided at a stage prior to the frequency conversion apparatus 150 is expected, so that sufficient performance is obtained.

It should be noted that the resonant frequency of the resonance section 153 may be variable. For example, the inductor (L) or the capacitance (C) within the resonance section 153 may be configured to be changeable. For example, in the case of a silicon tuner, an RF received frequency is a broadband of 40 MHz to 1 GHz. Therefore, the resonant frequency of the resonance section 153 may be configured to be changed in accordance with the received frequency. At that time, the capacitance may be variable.

<4. Third Embodiment>

<Local Signal Generation Section>

Next, a signal processing apparatus that generates a local signal will be described. As described above, when the duty ratio of the local signal (LO signal) is set to 1/3, the following can be obtained: HRR_3=∞. In this regard, two local signals having a 1/3 duty ratio and phases mutually shifted by a 1/2 period, which are mixed with the differential signal, may be generated.

For example, in the signal processing apparatus, a generation section may be provided, which generates two local signals having a 1/3 duty ratio and phases mutually shifted by a 1/2 period, the two local signals being mixed with the differential signal.

With this configuration, HRR_3 can be improved (the value can be increased), and a harmonic rejection ratio can be increased while suppressing an increase in power consumption.

It should be noted that the generation section may include a plurality of flip-flops that are connected in series in a ring form, and a computing section that calculates a logical OR of an input and an output of each of the flip-flops. Further, the generation section may cause each flip-flop to sequentially hold the value "1" according to an input clock signal.

Further, the frequency of the clock signal may be a sixfold frequency of that of the local signal, and the generation section may have a ring configuration constituted of six flip-flops and six computing sections and may output two local signals, which are outputs of two computing sections separated from each other with other two sections therebetween.

<Configuration>

Figure 8:
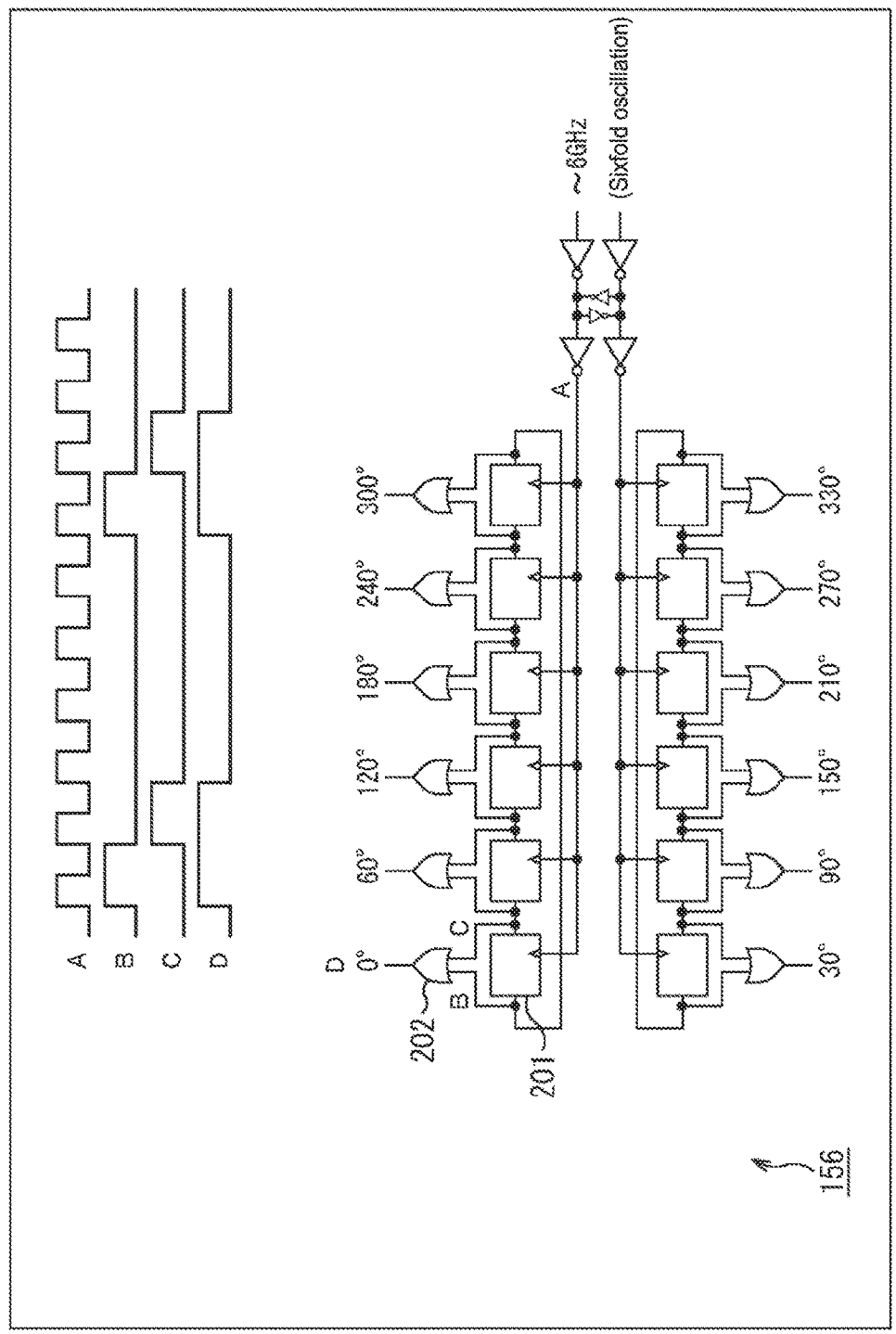
FIG. 8 is a diagram showing a main configuration example of a 1/3 duty LO signal generation section.

As an example of such a generation section, FIG. 8 shows a main configuration example of the 1/3 duty LO signal generation section 156 of FIG. 7. in the case of the example of FIG. 8, the 1/3 duty LO signal generation section 156 includes six D-flip-flops 201 and six OR gates 202 that are mutually connected in series in a ring form. Each of the six OR gates 202 calculate a logical OR of an input and an output of each of the D-flip-flops 201.

Figure 9:
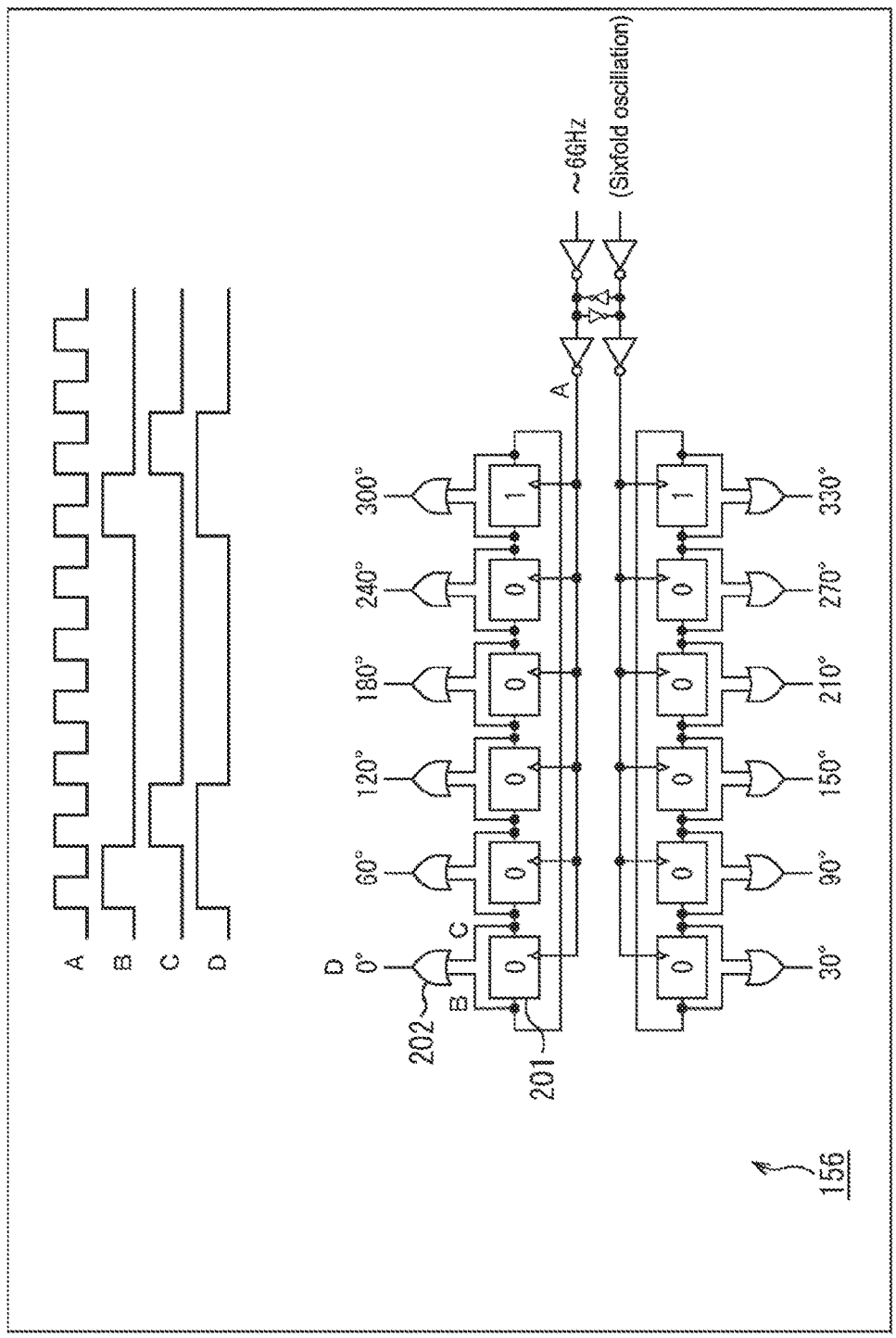
FIG. 9 is a diagram showing an example of an initial state of the 1/3 duty LO signal generation section.

At the time of reset (i.e., initial state), as shown in FIG. 9, the value "1" is set for one D-flip-flop 201, and the value "0" is set for the other D-flip-flops 201. As shown in FIG. 8, when a clock signal having a sixfold frequency (for example, 6 GHz) of the frequency (i.e., a desired frequency) of the local signal is input to the 1/3 duty LO signal generation section 156 (A), the value "1" is transferred to the next D-flip-flop 201 in synchronization with the clock signal. In the same manner, the value "1" circulates in the respective D-flip-flops 201 connected in a ring form (each of the D-flip-flops 201 sequentially holds the value "1").

Each of the OR gates 202 calculates a logical OR (D) of an input (B) and an output (C) of a corresponding ID-flip-flop 201. The logical OR is a signal having a desired frequency in which the duty ratio is 1/3, as shown in the upper side of FIG. 8. Therefore, out of those six OR gates, the output (logical OR) of the OR gate 202 corresponding to a desired phase is read as a local signal.

For example, when the output of the OR gate 202 of 0° and the output of the OR gate 202 of 180° in FIG. 8 are read, two local signals having a waveform as shown in part B of FIG. 6, i.e., having a 1/3 duty ratio and phases mutually shifted by a 1/2 period, are obtained.

With this configuration, the 1/3 duty LO signal generation section 156 can generate two local signals having a 1/3 duty ratio and phases mutually shifted by a 1/2 period, which are mixed with the differential signal. Therefore, it is possible to increase a harmonic rejection ratio while suppressing an increase in power consumption. In particular, with the configuration shown in the example of FIG. 8, the 1/3 duty LO signal generation section 156 can more easily generate two local signals having a 1/3 duty ratio and phases mutually shifted by a 1/2 period.

As a matter of course, since the phases of the two local signals only need to be mutually shifted by a 1/2 period, the outputs of the two OR gates 202 separated from each other with other two OR gates therebetween only need to be output as two local signals. For example, the output of the OR gate 202 of 60° and the output of the OR gate 202 of 240° in FIG. 8 may be read, or the output of the OR gate 202 of 120° and the output of the OR gate 202 of 300° in FIG. 8 may be read.

Further, in the example of FIG. 8, the 1/3 duty LO signal generation section 156 has two ring configurations each constituted of the above-mentioned six D-flip-flops 201 and six OR gates 202. By using the opposite phases of the clock signal, the OR gates 202 of one of the ring configurations correspond to 0°, 60°, 120°, 180°, 240°, and 300°, and the OR gates 202 of the other ring configuration correspond to 30°, 90°, 150°, 210°, 270°, and 330°. Therefore, the output of the OR gate 202 of 30° and the output of the OR gate 202 of 210° in FIG. 8 may be read, the output of the OR gate 202 of 90° and the output of the OR gate 202 of 270° in FIG. 8 may be read, or the output of the OR gate 202 of 150° and the output of the OR gate 202 of 330° in FIG. 8 may be read.

It should be noted that the configuration of the 1/3 duty LO signal generation section 156 is optional and is not be limited to the example of FIG. 8 or FIG. 9. For example, instead of the above-mentioned D-flip-flops 201, other flip-flops may be applied. Further, the number of D-flip-flops 201 or OR gates 202 is optional as long as the D-flip-flops 201 or OR gates 202 correspond to the frequency of the clock signal. In other words, if the frequency of the input clock signal is other than a sixfold frequency of a desired frequency, the number of D-flip-flops 201 or OR gates 202 can be changed accordingly.

<IQ Channels>

Further, the mixing section may include a path of an I channel and a path of a Q channel and mix local signals having a mutual phase difference of 90 degrees with the I channel and the Q channel of a differential signal.

Further, the generation section may have two sets of the above-mentioned ring configuration, and generate a local signal for the I channel by one of the ring configurations and a local signal for the Q channel by the other ring configuration, the local signal for the Q channel having a mutual phase difference of 90 degrees from the local signal for the I channel.

Figure 10:
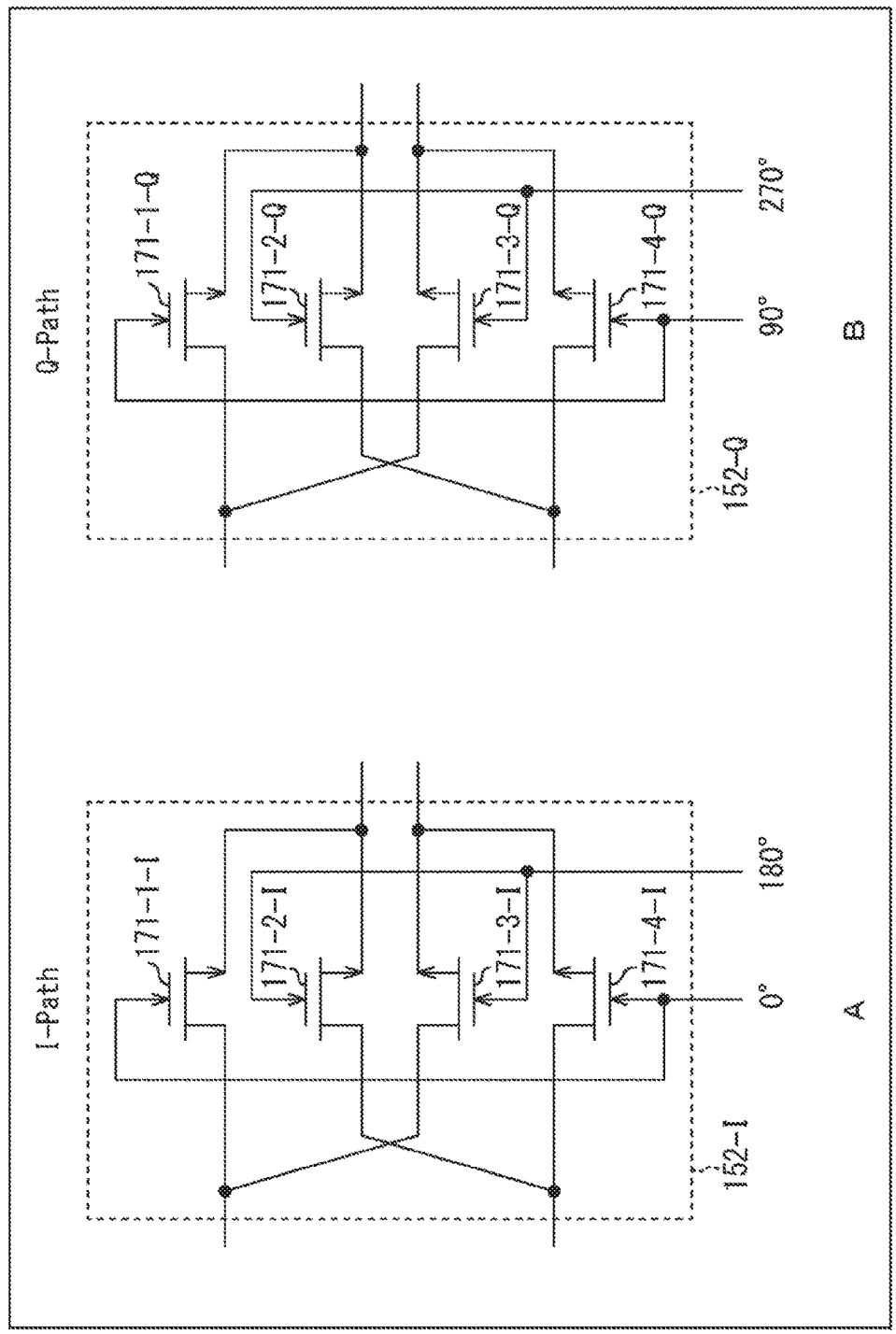
FIG. 10 is a diagram showing an example of a phase of an LO signal supplied to IQ channels of a mixing section.

For example, a mixing section 152-1 shown in part A of FIG. 10 is an I channel path (I-Path) of the mixing section 152 of the frequency conversion apparatus 150 shown in FIG. 7, Further, a mixing section 152-Q shown in part B of FIG. 10 is a Q channel path (Q-Path) of the mixing section 152 of the frequency conversion apparatus 150 shown in FIG. 7.

The 1/3 duty LO signal generation section 156 in the example of FIG. 8 can generate local signals having a desired phase at every 30°, and thus easily supply local signals having a 1/3 duty and phases of 0° and 180° to the mixing section 152-1 and supply local signals having phases of 90° and 270° to the mixing section 152-Q.

As a matter of course, since a local signal supplied to the I channel path and a local signal supplied to the Q channel path only need to have a mutual phase difference of 90°, the 1/3 duty LO signal generation section 156 can also supply a local signal having a phase other than the examples described above. For example, the 1/3 duty LO signal generation section 156 can also supply local signals having a 1/3 duty and phases of 30° and 210° to the mixing section 152-1 and supply local signals having phases of 120° and 300° to the mixing section 152-Q.

Further, the 1/3 duty LO signal generation section 156 may be configured as an apparatus independent from the frequency conversion apparatus 150. Further, an apparatus including the 1/3 duty LO signal generation section 156 may include the mixing section 152.

Hereinabove, the 1/3 duty LO signal generation section 156 of FIG. 7 has been described. This description can also be applied to the 1/3 duty LO signal generation section 102 of FIG. 6. For example, the 1/3 duty LO signal generation section 102 may be configured as the example of FIG. 8 or the like.

<5. Fourth Embodiment>
<Signal Generation Section>

It should be noted that the configuration of the signal processing apparatus that generates the local signal is not limited to the example described in the third embodiment. For example, the generation section may include a frequency divider section that generates a local signal having a 1/3 frequency and a 1/3 duty ratio with respect to a clock signal having a threefold frequency of that of the local signal. Further, the frequency divider section may include a counter that counts a clock signal, a reset control section that resets the counter to "0" when an output value of the counter reaches "3", and an output control section that outputs the value "1" when the value of the counter is "2", and outputs the value "0" when the output value of the counter is "1" or "0".

<Configuration>

Figure 11:
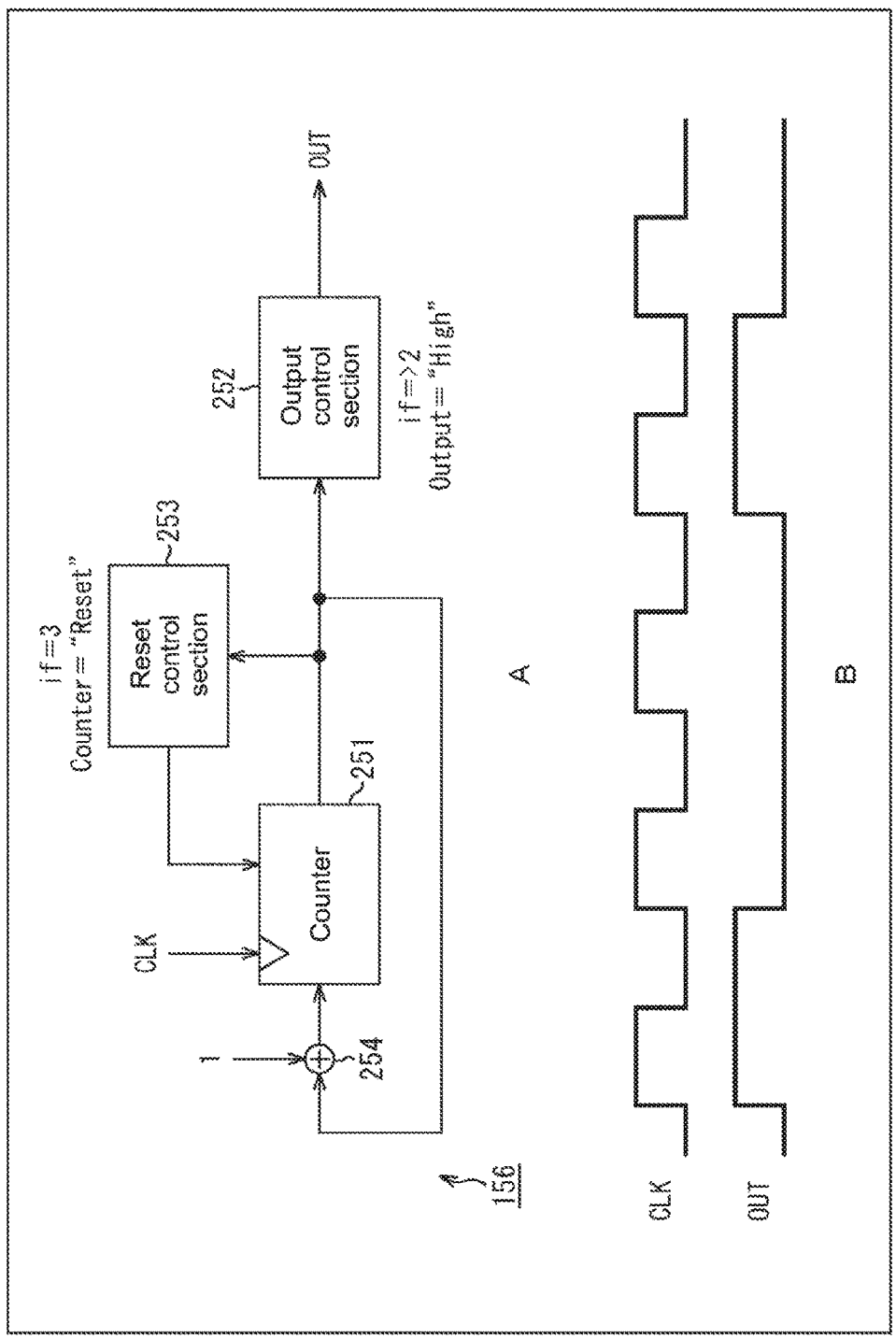
FIG. 11 is a diagram showing a main configuration example of the 1/3 duty LO signal generation section.

Another configuration example of the 1/3 duty LO signal generation section 156 is shown in part A of FIG. 11. In the case of the example of part A of FIG. 11, the 1/3 duty LO signal generation section 156 includes a counter 251, an output control section 252, a reset control section 253, and a computing section 254.

The counter 251 counts a clock signal (CLK) and increments a count value per period of the clock signal, like 0, 1, 2. More specifically, the counter 251 holds the output of the computing section 254 and updates that value in synchronization with the clock signal. The counter 251 supplies the count value (held value) to the output control section 252 to the computing section 254.

The output control section 252 outputs the value "1" when the count value supplied from the counter 251 is "2", and outputs the value "0" when the count value supplied from the counter 251 is "1" or "0" (OUT).

The reset control section 253 resets initializes) the count value (held value) of the counter 251 when the count value supplied from the counter 251 is "3". For example, the reset control section 253 sets the count value of the counter 251 to the value "0".

The computing section 254 adds "1" to the count value supplied from the counter 251. In other words, the computing section 254 increments the count value. The computing section 254 supplies a result of the addition (i.e., updated count value) to the counter 251 and causes the counter 251 to hold the result.

By the 1/3 duty LO signal generation section 156 having such a configuration, a local signal (OUT) having a 1/3 duty ratio is obtained as shown in part B of FIG. 11. Further, by using the opposite phase of the clock signal, the 1/3 duty LO signal generation section 156 can easily generate a local signal having a 1/2 period of phase difference from the local signal shown in part B of FIG. 11.

<Simulation Results>

Figure 12:
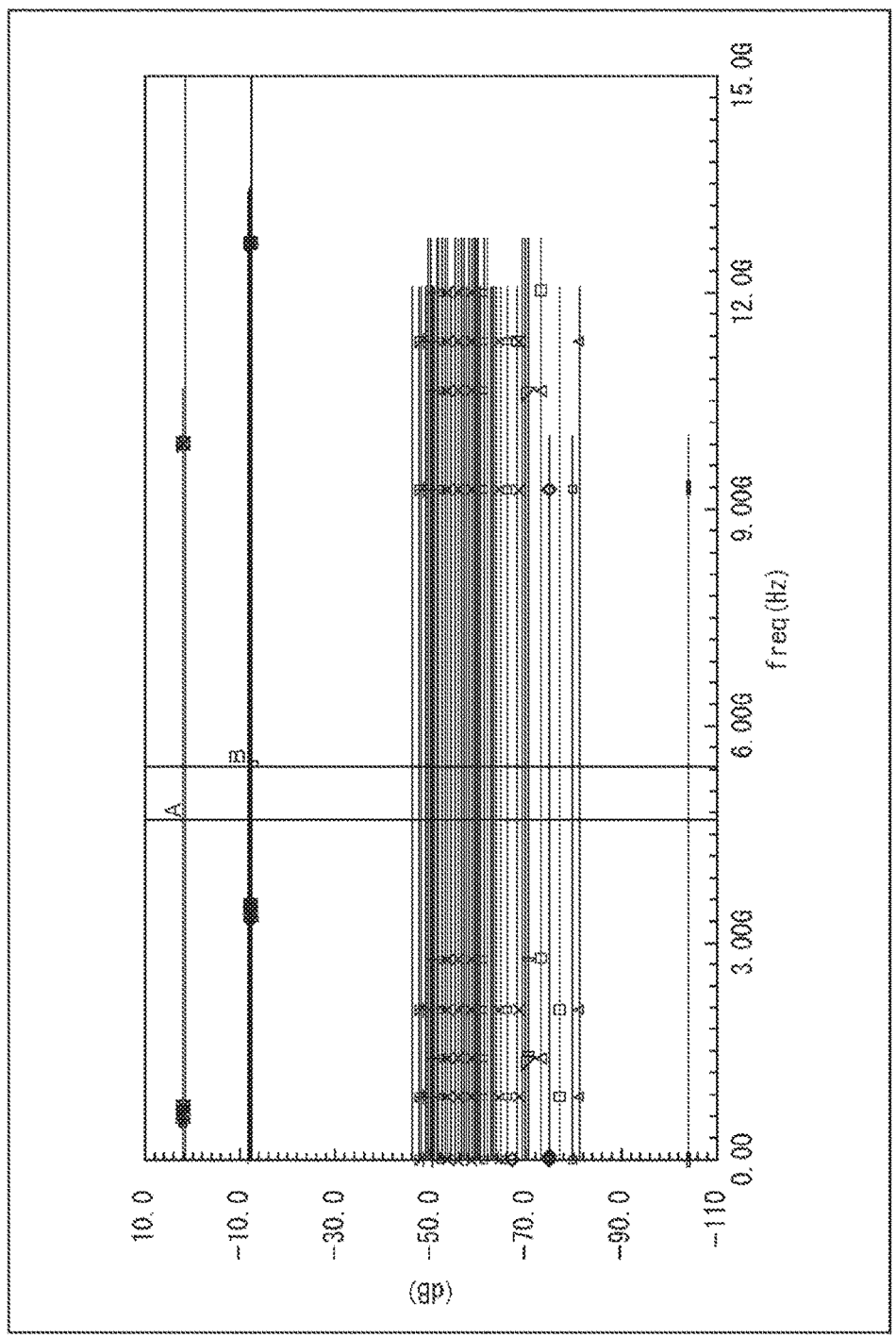
FIG. 12 is a diagram for describing as example of simulation results.

FIG. 12 shows examples of simulation results of the duty ratio when frequency conversion is performed using the local signal generated by the 1/3 duty LO signal generation section 156 having the configuration example of FIG. 8.

As shown in FIG. 12, is almost all frequency bands, particularly is frequency bands close to the frequency of a reference wave, the harmonic rejection ratio (HRR) can be set to 46 dB or more. In such a manner, applying the present technology can increase the harmonic rejection ratio while suppressing an increase in power consumption.

<6. Fifth Embodiment>
<Current Control When Local Signal is Low>

For example, in the frequency conversion apparatus 150 of FIG. 7, a local signal generated by the 1/3 duty LO signal generation section 156 and supplied to the switch 171-1 and the switch 171-4 of the mixing section 152 is assumed as LOP(f(t)), and a local signal generated by the 1/3 duty LO signal generation section 156 and supplied to the switch 171-2 and the switch 171-3 of the mixing section 152 is assumed as LON(f(t−Ts/2)).

The local signal LOP and the local signal LON have a 1/3 duty ratio and phases mutually shifted by a 1/2 period. Therefore, is addition to a case where the local signal LOP is High and the local signal LON is Low and a case where the local signal LOP is Low and the local signal ION is High, there is a case where the local signal LOP and the local signal ION are Low.

Figure 13:
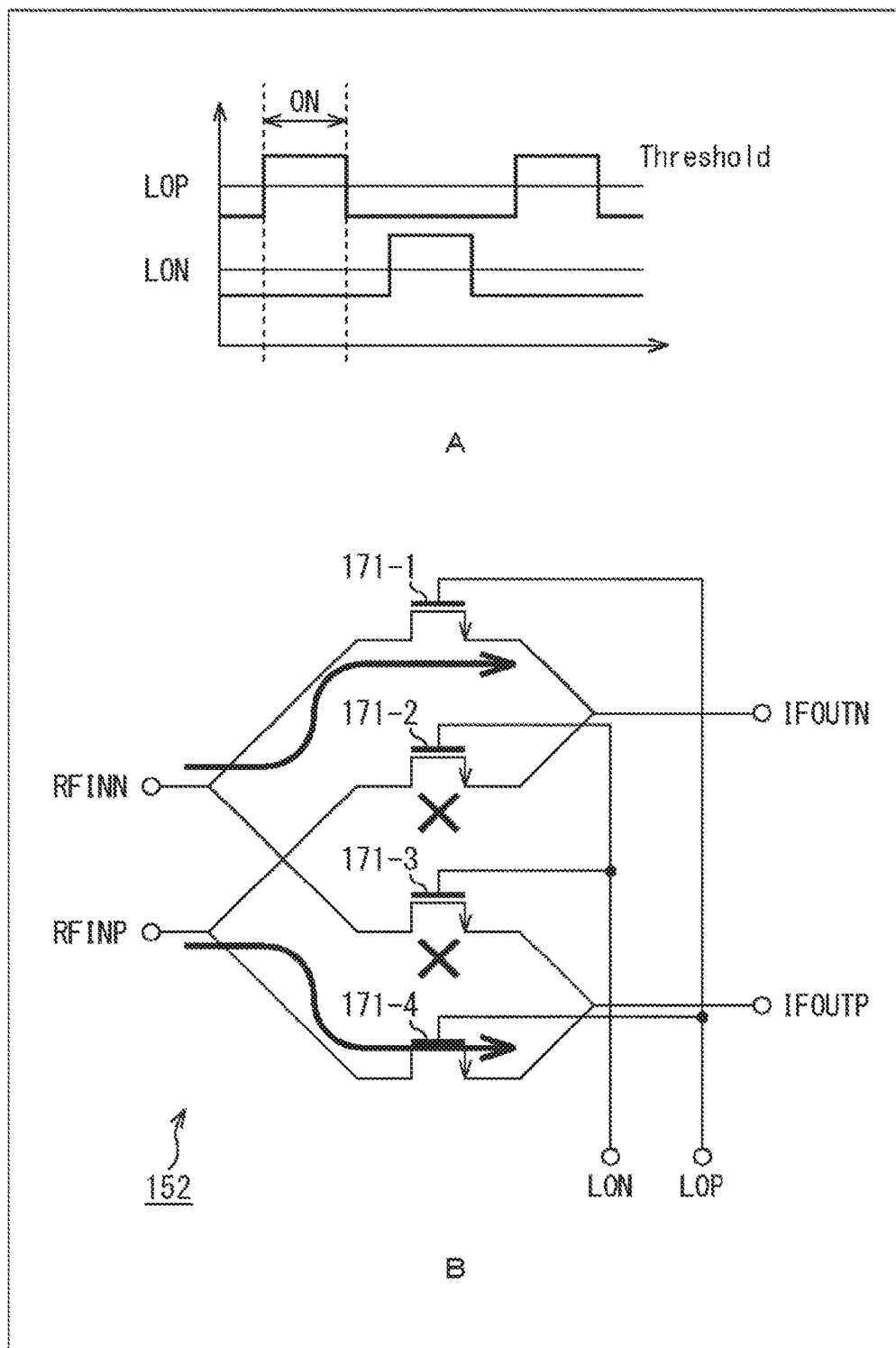
FIG. 13 is a diagram showing an example of a status of the mixing section.

For example, as shown in part A of FIG. 13, in the case where the local signal LOP is High and the local signal ION is Low, as shows in part B of FIG. 13, the switch 171-1 and the switch 171-4 are turned ON in the mixing section 152, and thus a current flowing in the mixing section 152 from the RF side flows to the IF side via the switch 171-1 and the switch 171-4 (the current is output from an output terminal IFOUTN and an output terminal IFOUTP to a subsequent stage).

Figure 14:
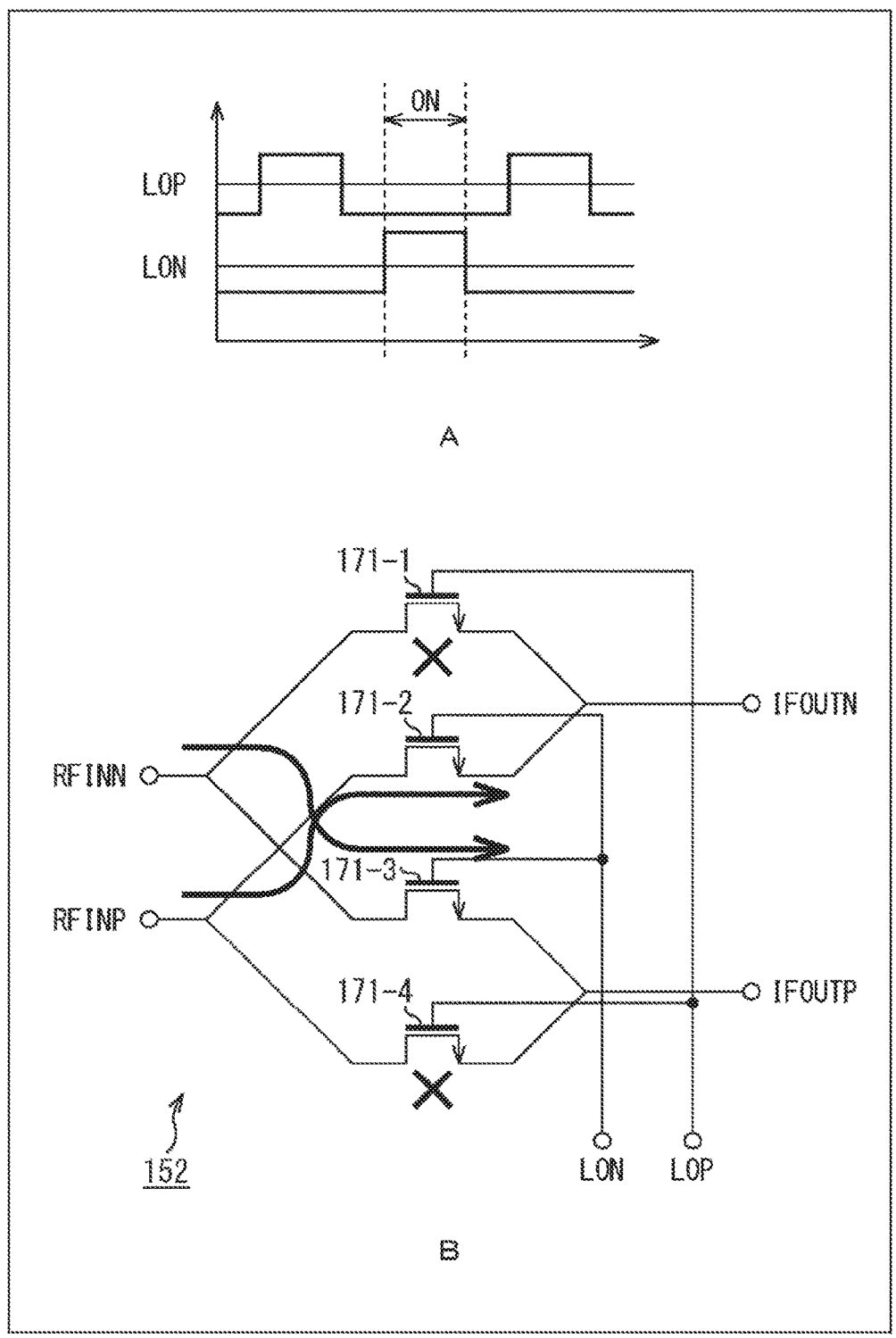
FIG. 14 is a diagram showing an example of a status of the mixing section.

Further, for example, as shown in part A of FIG. 14, in the case where the local signal LOP is Low and the local signal LON is High, as shown in part B of FIG. 14, the switch 171-2 and the switch 171-3 are turned ON in the mixing section 152, and thus a current flowing in the mixing section 152 from the RF side flows to the IF side via the switch 171-2 and the switch 171-3 (the current is output from the output terminal IFOUTN and the output terminal IFOUTP to a subsequent stage).

Figure 15:
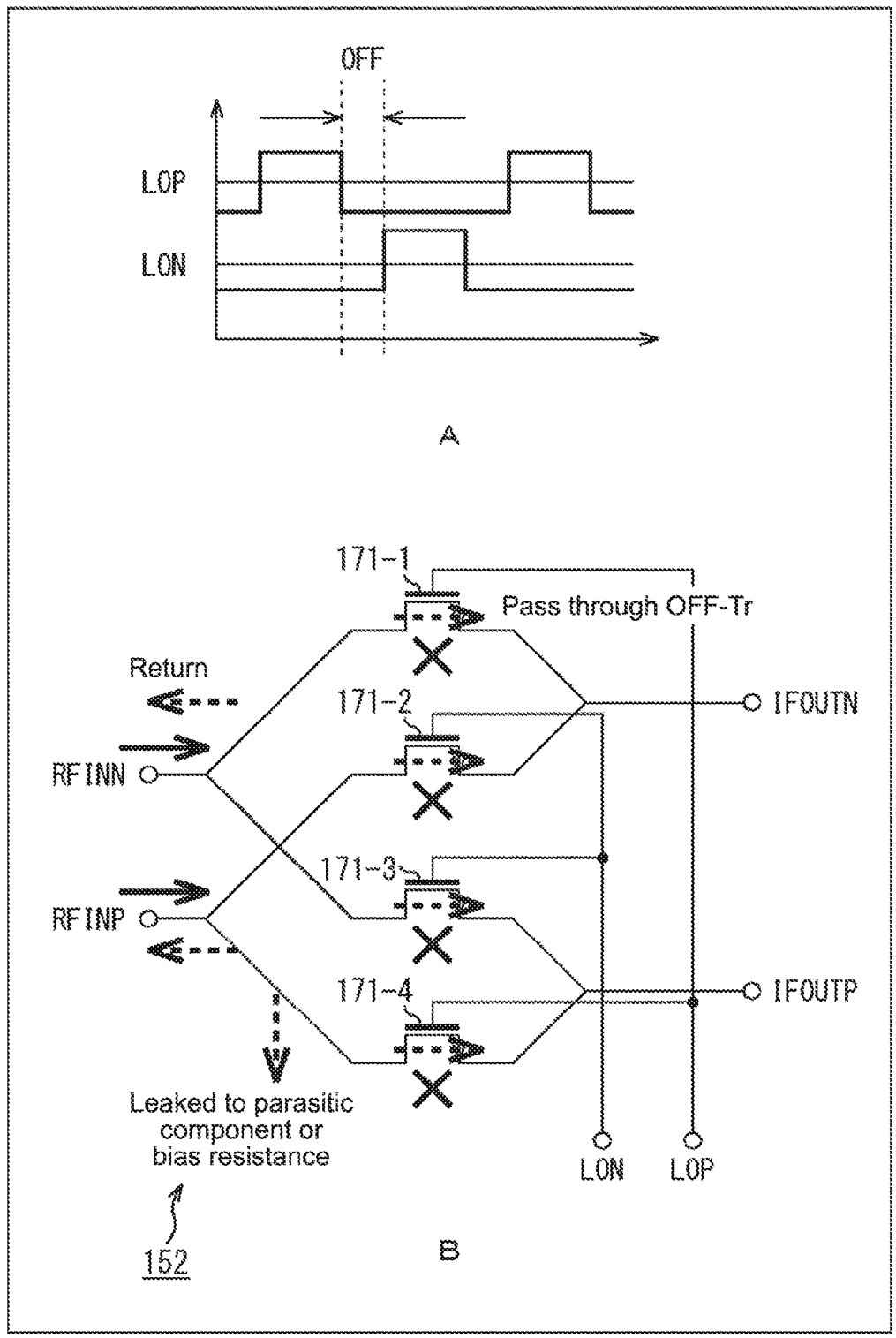
FIG. 15 is a diagram showing an example of status of the mixing section.

However, for example, as shown in part A of FIG. 15, in the case where the local signal LOP and the local signal LON are Low, as shown in part B of FIG. 15, all of the switches 171 are turned OFF in the mixing section 152. Thus, a current flowing in the mixing section 152 from the RF side cannot flow to the IF side (the current cannot be output from the output terminal IFOUTN and the output terminal IFOUTP to a subsequent stage) and may be reflected (return) to the RF side (a stage prior to an input terminal RFINN and an input terminal RFINP) or may be leaked to a parasitic component or a bias resistance. Such reflection or leakage of the current becomes a factor that disturbs the waveform and may become a cause that inhibits the harmonic rejection ratio from being increased.

In this regard, in this mixing section, in the case where both the two local signals are Low, a signal line, which transmits an input differential signal, is short-circuited to a predetermined potential or signal lines, which transmit the input differential signal, are short-circuited with each other.

With this configuration, it is possible to suppress the reflection (return) to the RF side or leakage to a parasitic component or a bias resistance. That is, it is possible to suppress the disturbance of the waveform of the differential signal. Therefore, the harmonic rejection ratio can be increased.

<Frequency Conversion Apparatus>

Figure 16:
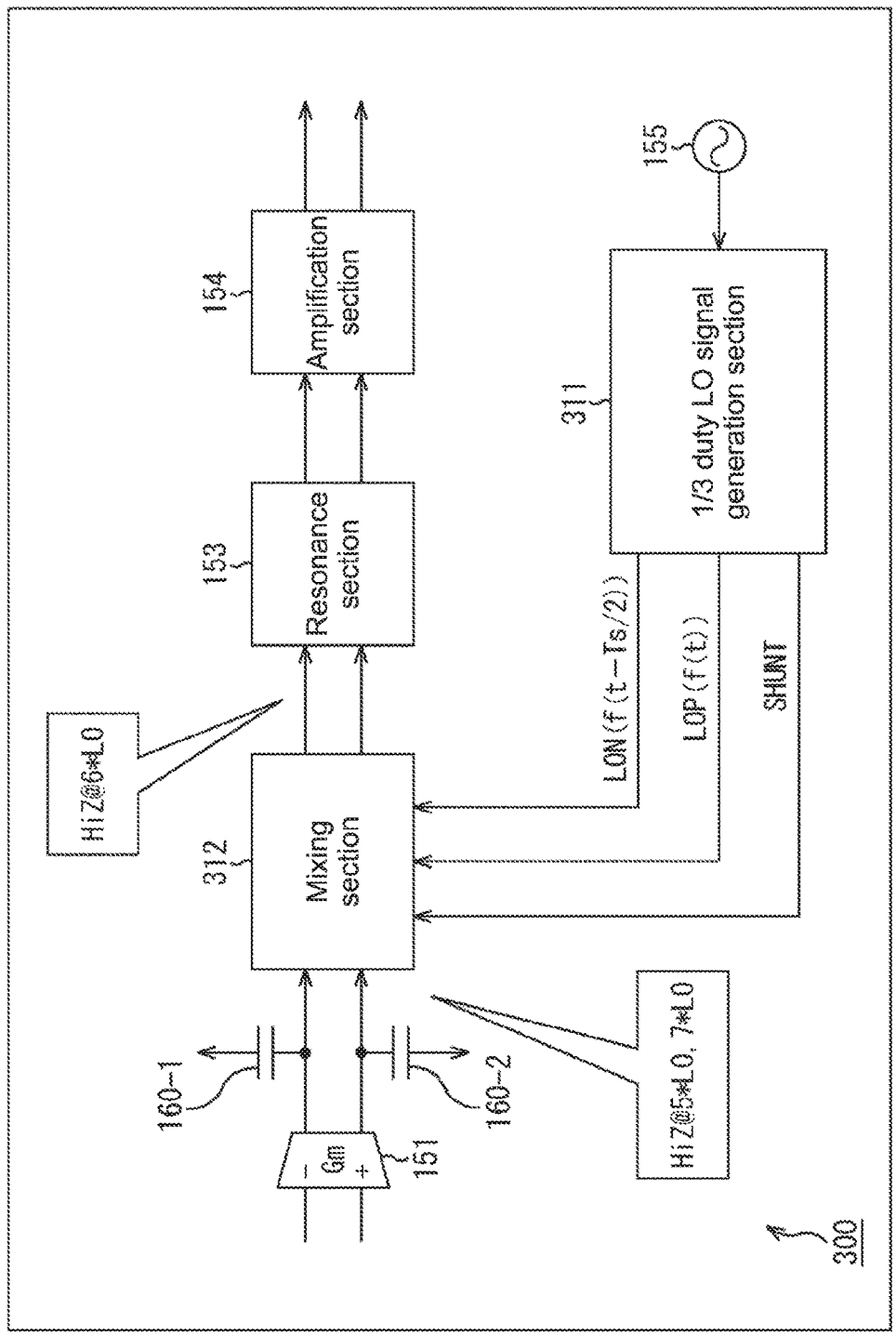
FIG. 16 is a diagram showing a main configuration example of a frequency conversion apparatus.

A frequency conversion apparatus 300 shown in FIG. 16 is an apparatus that converts a frequency of an input differential signal as in the case of the frequency conversion apparatus 150 shown in FIG. 7. In other words, the frequency conversion apparatus 300 mixes two local signals having a 1/3 duty ratio and phases mutually shifted by a 1/2 period with each signal of the differential signal and calculates a difference between results of the mixing of the two local signals. Further, in the case where both the two local signals are Low, as described above, the frequency conversion apparatus 300 short-circuits a signal line, which transmits the input differential signal, to a predetermined potential or short-circuits signal lines, which transmit the input differential signal, with each other.

As shown in FIG. 16, the frequency conversion apparatus 300 includes a voltage/current conversion section 151, a mixing section 312, a resonance section 153, an amplification section 154, an oscillation section 155, a 1/3 duty LO signal generation section 311, a capacitor 160-1, and a capacitor 160-2. It should be noted that the frequency conversion apparatus 300 may include capacitors 157, a bias application section 158, and resistors 159 as in the case of the frequency conversion apparatus 150 of FIG. 7

As in the case of the 1/3 duty LO signal generation section 156, the 1/3 duty LO signal generation section 311 generates two local signals (LOP and LON) having a 1/3 duty ratio and phases mutually shifted by a 1/2 period by using a clock signal supplied from the oscillation section 155. The frequencies of those local signals are optional. However, the frequencies of the respective local signals are identical to each other. In other words, the 1/3 duty LO signal generation section 156 has a function similar to that of the 1/3 duty LO signal generation section 102 of FIG. 6. The 1/3 duty LO signal generation section 311 supplies the generated two local signals (LOP and LON) to the mixing section 312.

Further, the 1/3 duty LO signal generation section 311 generates a control signal for performing control to short-circuit a signal line, which transmits the input differential signal, to a predetermined potential or to short-circuit signal lines, which transmit the input differential signal, with each other in the case where both the two local signals are Low. The 1/3 duty LO signal generation section 311 supplies the generated control signal to the mixing section 312.

As in the case of the mixing section 152 of FIG. 7, the mixing section 312 mixes the local signals (LOP and ION) generated in the 1/3 duty LO signal generation section 311 with the differential signal output from the voltage/current conversion section 151, and outputs results of the mixing.

Further, on the basis of the control signal supplied from the 1/3 duty LO signal generation section 311, the mixing section 312 short-circuits a signal line, which transmits the input differential signal, to a predetermined potential or short-circuits signal lines, which transmit the input differential signal, with each other in the case where both the two local signals (LOP and LON) are Low (i.e., in a period of time during which both the local signal LOP and the local signal LON are Low).

<Configuration of 1/3 Duty LO Signal Generation Section>

Figure 17:
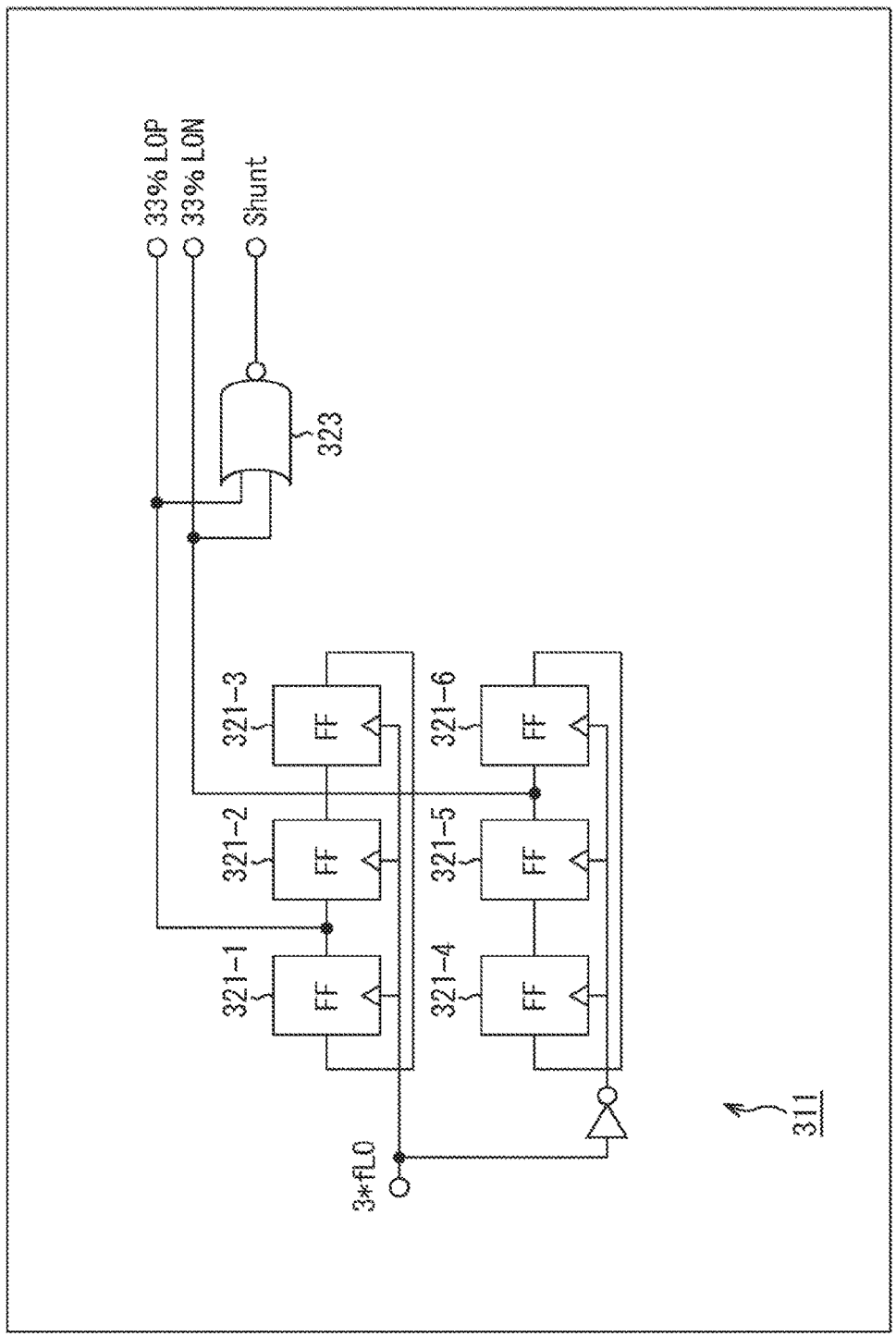
FIG. 17 is a diagram showing a main configuration example of a 1/3 duty LO signal generation section.

FIG. 17 shows a main configuration example of the 1/3 duty LO signal generation section 311. In a case of the example of FIG. 17, the 1/3 duty LO signal generation section 311 includes a D-flip-flop 321-1 to a D-flip-flop 321-6. The D-flip-flop 321-1 to the D-flip-flop 321-6 are referred to as D-flip-flop(s) 321 unless otherwise distinguished from one another.

The D-flip-flop 321-1 to the D-flip-flop 321-3 are mutually connected in series in a ring form. A clock signal (3*fLO) having a 1/2 duty ratio and a threefold frequency of that of the local signal is supplied to the D-flip-flop 321-1 to the D-flip-flop 321-3. The value "1" is set (held) in any one of the D-flip-flop 321-1 to the D-flip-flop 321-3, and according to this clock signal, the value "1" circulates in the D-flip-flop 321-1 to the D-flip-flop 321-3 (the value "1" is transferred to the next D-flip-flop 321 in each period of the clock signal).

The output of any one of the D-flip-flops 321 (e.g., D-flip-flop 321-1) is then supplied as a local signal LOP to the mixing section 312. Since this ring is formed by the three D-flip-flops 321, the local signal LOP becomes High in one period out of the three periods of the clock signal. Therefore, the duty ratio of the local signal LOP becomes 1/3.

Similarly, the D-flip-flop 321-4 to the D-flip-flop 321-6 are also mutually connected in series in a ring form. The 1/3 duty LO signal generation section 311 further includes a NOT gate 322. The clock signal (3*fLO) having a 1/2 duty ratio and a threefold frequency of that of the local signal is supplied to each of the ID-flip-flop 321-4 to the D-flip-flop 321-6 via the NOT gate 322. In other words, a logical NOT of the clock signal (i.e., clock signal having a phase shifted by a 1/2 period) is supplied to the D-flip-flop 321-4 to the D-flip-flop 321-6. According to the clock signal having a phase shifted by a 1/2 period, the value "1" circulates in the D-flip-flop 321-4 to the D-flip-flop 321-6 (the value "1" is transferred to the next D-flip-flop 321 in each period of the clock signal).

The output of any one of the D-flip-flops 321 (e.g., D-flip-flop 321-5) is then supplied as a local signal LON having a 1/3 duty ratio to the mixing section 312. Since this ring is formed by the three D-lip-flops 321, the local signal LON becomes High in one period out of the three periods of the clock signal. Therefore, the duty ratio of the local signal LON becomes 1/3.

It should be noted that a D-flip-flop 321 whose output signal is taken out as the local signal LON in the ring of the D-flip-flop 321-4 to the D-flip-flop 321-6 is determined in accordance with a D-flip-flop 321 whose output signal is taken out as the local signal LOP in the ring of the D-flip-flop 321-1 to the D-flip-flop 321-3. In other words, the output of the D-flip-flop 321 from which the local signal LON shifted by a 1/2 period with respect to the local signal LOP is obtained is selected.

In the case of the example of FIG. 17, in the ring of the D-flip-flop 321-1 to the D-flip-flop 321-3, the output of the D-flip-flop 321-1 is selected as the local signal LOP. Thus, in the ring of the D-flip-flop 321-4 to the D-flip-flop 321-6, the output of the D-flip-flop 321-5 is selected as the local signal LON. In the D-flip-flop 321-5, the position thereof is shifted by a 1/3 period of the period of the local signal with respect to the D-flip-flop 321-1, and the operation thereof is also shifted by 1/6 period (1/2 period of 3*fLO) of the period of the local signal. Therefore, the output of the D-flip-flop 321-5 is shifted by a 1/2 period of that of the local signal with respect to the output of the D-flip-flop 321-1.

It should be noted that the configuration for generating the local signal LOP and the local signal LON is optional and is not limited to the example of FIG. 17. For example, the configuration may be the configuration as described with reference to FIG. 8 or FIG. 9 or may use the configuration as described with reference to FIG. 11. Further, for example, instead of the above-mentioned D-flip-flops 321, other flip-flops may be applied.

The 1/3 duty LO signal generation section 311 further includes a NOR gate 323. The NOR gate 323 calculates a NOR of the local signal LOP and the local signal LON. The 1/3 duty LO signal generation section 311 supplies a result of the calculation, which serves as a control signal Shunt, to the mixing section 312. In other words, the NOR gate 323 generates a control signal Shunt.

Figure 18:
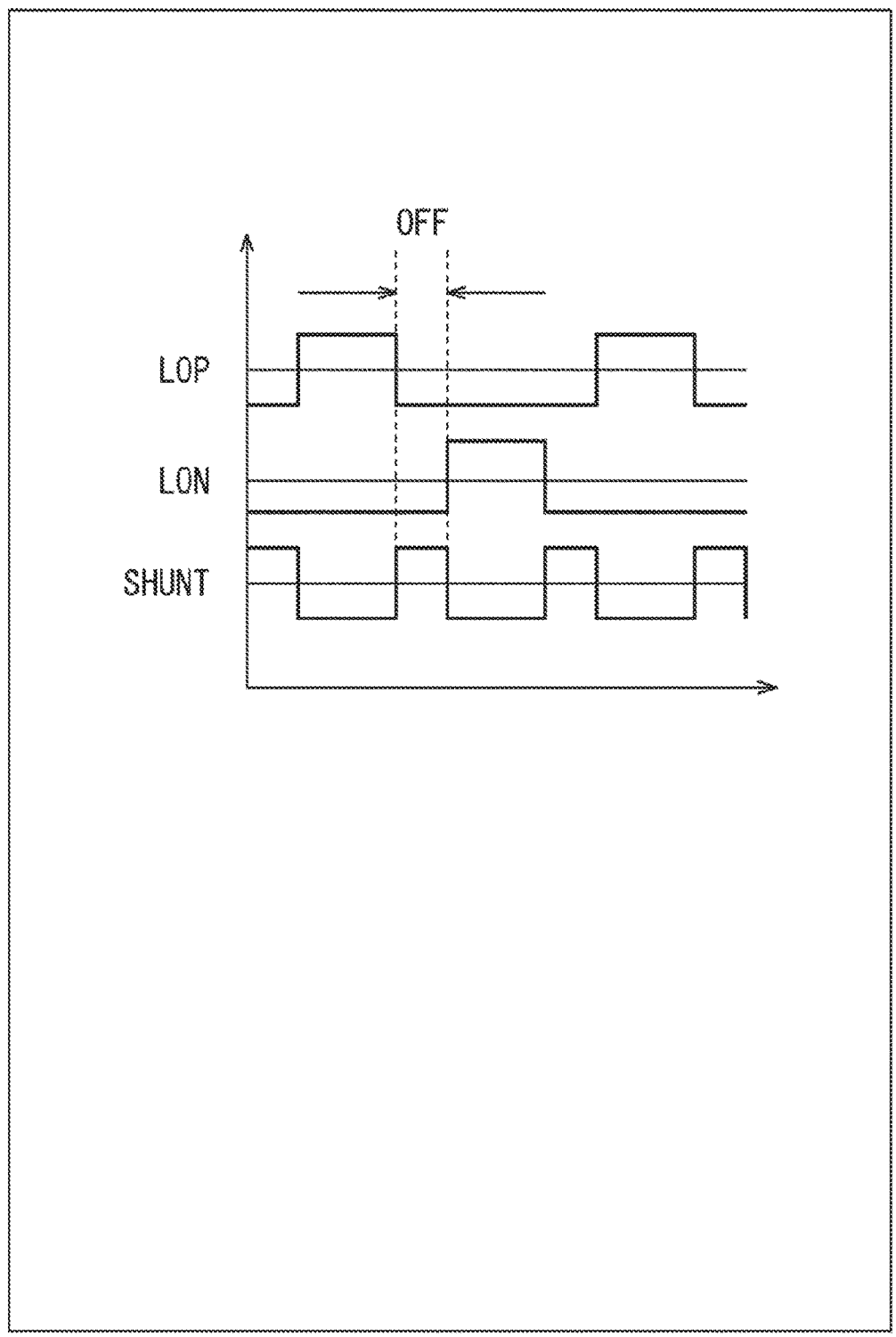
FIG. 18 is a diagram showing a waveform example of a signal generated by the 1/3 duty LO signal generation section.

As shown in an example of FIG. 18, the value of this control signal Shunt becomes High in a period of time during which both the local signal LOP and the local signal LON are Low, and becomes Low in the other periods of time.

It should be noted that a method of generating the control signal Shunt is optional as long as the control signal Shunt having the waveform as shown in FIG. 18 can be generated. The control signal Shunt may be generated using a configuration other than the NOR gate 323.

<Mixing Section>

Figure 19:
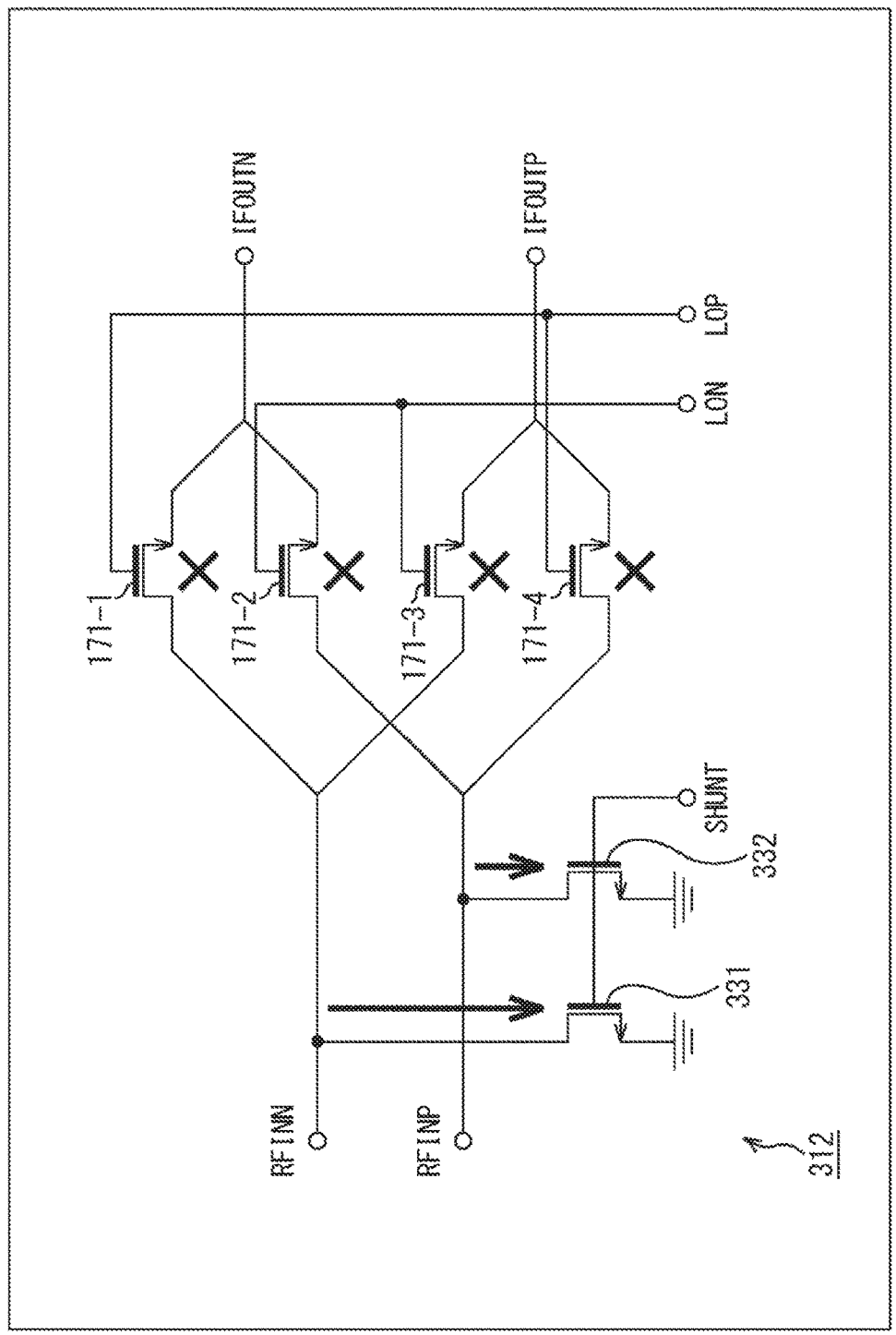
FIG. 19 is a diagram showing a main configuration example of a mixing section.

FIG. 19 shows a main configuration example of the mixing section 312. As shown in FIG. 19, in this case, the mixing section 312 includes the configuration similar to that of the mixing section 152 of FIG. 7, a switch 171-1 to a switch 171-4, and further includes a switch 331 and a switch 332.

On the basis of the control signal Shunt supplied from the 1/3 duty LO signal generation section 311, the switch 331 short-circuits, to the ground potential, a signal line (i.e., input terminal RFINN) that transmits a negative-side signal of the differential signal input to the mixing section 312 and is on the input side (the RF side) relative to the switch 171-1 and the switch 171-3. In other words, the switch 331 short-circuits a signal line on the RF side, which transmits a negative-side signal of the differential signal, to the ground potential (GND), in a period of time during which both the local signal LOP and the local signal LON are Low. Accordingly, a current flowing is the mixing section 152 from the RF side can flow in the GND, and thus the reflection of the current to the RF side (stage prior to the input terminal RFINN) or leakage thereof to a parasitic component or a bias resistance is suppressed.

Similarly, on the basis of the control signal Shunt supplied from the 1/3 duty LO signal generation section 311, the switch 332 short-circuits, to the ground potential, a signal line (i.e., input terminal RFINP) that transmits a positive-side signal of the differential signal input to the mixing section 312 and is on the input side (the RF side) relative to the switch 171-2 and the switch 171-4. In other words, the switch 332 short-circuits a signal line on the RF side, which transmits a positive-side signal of the differential signal, to the ground potential (GND), in a period of time during which both the local signal LOP and the local signal LON are Low. Accordingly, a current flowing in the mixing section 152 from the RP side can flow in the GND, and thus the reflection of the current to the RF side (stage prior to the input terminal RFINP) or leakage thereof to a parasitic component or a bias resistance is suppressed.

As described above, in the case where both the two local signals are Low, the mixing section 312 short-circuits the signal line on the RP side, which transmits the input differential signal, to the ground potential, so that the disturbance of the waveform is suppressed. Thus, the frequency conversion apparatus 300 can increase the harmonic rejection ratio.

It should be noted that a potential to which the switch 331 and the switch 332 short-circuit the signal line on the RF side, which transmits the input differential signal, is optional and may be a potential other than the ground potential. For example, on the basis of the control signal Shunt supplied from the 1/3 duty LO signal generation section 311, the switch 331 may short-circuit the signal line on the RF side, which transmits a negative-side signal of the differential signal, to a predetermined common potential in a period of time during which both the local signal LOP and the local signal LON are Low. Further, for example, on the basis of the control signal Shunt supplied from the 1/3 duty LO signal generation section 311, the switch 332 may short-circuit the signal line on the RF side, which transmits a positive-side signal of the differential signal, to the predetermined common potential in a period of time during which both the local signal LOP and the local signal LON are Low.

<Mixing Section>

Figure 20:
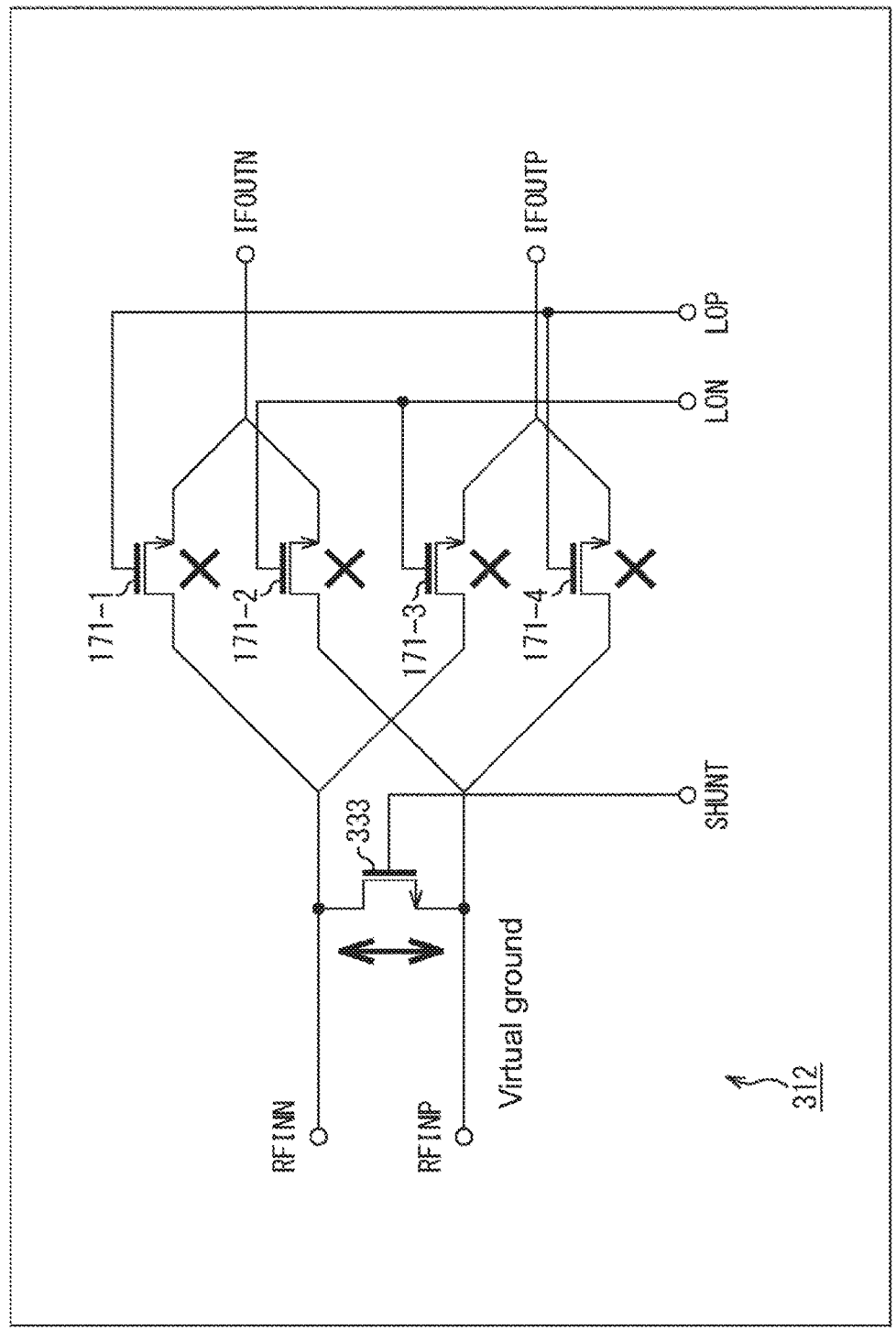
FIG. 20 is a diagram showing a main configuration example of the mixing section.

FIG. 20 shows another configuration example of the mixing section. 312. As shown in FIG. 20, in this case, the mixing section 312 includes the configuration similar to that of the mixing section 152 of FIG. 7, a switch 171-1 to a switch 171-4, and further includes a switch 333.

On the basis of the control signal Shunt supplied from the 1/3 duty LO signal generation section 311, the switch 333 short-circuits a signal line (i.e., input terminal RFINN) that transmits a negative-side signal of the differential signal input to the mixing section 312 and is on the input side (the RF side) relative to the switch 171-1 and the switch 171-3 and a signal line (i.e., input terminal RFINP) that transmits a positive-side signal of the differential signal input to the mixing section 312 and is on the input side (the RF side) relative to the switch 171-2 and the switch 171-4 with each other. In other words, the switch 333 short-circuits signal lines on the RF side, which transmit the differential signal, with each other in a period of time during which both the local signal LOP and the local signal LON are Low. Accordingly, a positive-side current and a negative-side current flowing in the mixing section 152 from the RF side are cancelled out, and thus the reflection of the current. to the RF side (stage prior to the input terminal RFINN and the input terminal RFINP) or leakage thereof to a parasitic component or a bias resistance is suppressed.

As described above, in the case where both the two local signals are Low, the mixing section 312 short-circuits the signal lines, which transmit the input differential signal, with each other, so that the disturbance of the waveform is suppressed. Thus, the frequency conversion apparatus 300 can increase the harmonic rejection ratio.

<Current Control by 1/3 Duty LO Signal Generation Section>

As described above, the 1/3 duty LO signal generation section 311 can control the mixing section 312 to short-circuit the signal line, which transmits the input differential signal, to the ground potential or to short-circuit signal lines, which transmit the input differential signal, with each other in the case where both the two local signals are Low. Accordingly, the frequency conversion apparatus 300 can increase the harmonic rejection ratio.

In other words, the 1/3 duty LO signal generation section 311 can generate a control signal for controlling the mixing section 312 to short-circuit a signal line, which transmits the input differential signal, to a predetermined potential or to short-circuit signal lines, which transmit the input differential signal, with each other in the case where both the two local signals are Low.

It should be noted that the configuration other than the 1/3 duty LO signal generation section 311 and the mixing section 312 of the frequency conversion apparatus 300 is optional and is not limited to the example of FIG. 16. For example, in the mixing section 103 of the frequency conversion apparatus 100 shown in part A of FIG. 6, in the case where both the two local signals are Low, it may be possible to short-circuit a signal line signal line (i.e., signal line on the RF side relative to each switch section 112 side), which transmits the input differential signal, to a predetermined potential or to short-circuit signal lines (i.e., signal lines on the RF side relative to each switch section 112 side), which transmit the input differential signal, with each other.

With this configuration, the technology described in this embodiment can be applied to the frequency conversion apparatus 100, and the harmonic rejection ratio can be increased.

<Others>

Further, in the above description, the configuration described as one apparatus (or processing section) may be divided and configured as a plurality of apparatuses (or processing sections). Conversely, in the above description, the configurations described as a plurality of apparatuses (or processing sections) may be integrated and configured as one apparatus (or processing section). Further, as a matter of course, configurations other than the configurations described above may be added to the configuration of each apparatus (or each processing section). Furthermore, if the configuration or operation of the entire system is substantially the same, a part of the configuration of a certain apparatus (or processing section) may be included in the configuration of another apparatus (or another processing section).

Hereinabove, suitable embodiments of the present disclosure have been described in detail with reference to the attached drawings, but the technical scope of the present disclosure is not limited to the examples. It is obvious that a person ordinarily skilled in the technical field of the present disclosure could have arrived at various changed examples or modified examples in the scope of the technical idea described in the Claims, and it is naturally understood that those examples also belong to the technical scope of the present disclosure.

For example, the present technology can have a configuration of cloud computing in which a plurality of apparatuses share one function and cooperate to perform processing via a network.

Further, the present technology is not limited to the above and can be implemented as any configuration mounted to an apparatus forming the apparatus or system as described above, such as a processor as a system LSI (Large Scale Integration) or the like, a module using a plurality of processors or the like, a unit using a plurality of modules or the like, and a set or the like (i.e., a part of a configuration of the apparatus) obtained by adding another function to a unit.

It should be noted that the present technology can have the following configurations.

(1) A signal processing apparatus, including
  a mixing section that has a differential configuration, mixes two local signals with each signal of a differential signal, and calculates a difference between results of the mixing of the two local signals, the two local signals having a 1/3 duty ratio and phases mutually shifted by a 1/2 period.
(2) The signal processing apparatus according to (1), further including
  a resonance section that resonates with the differential signal, with which the local signals are mixed by the mixing section, at a predetermined resonant frequency.
(3) The signal processing apparatus according to (2), in which
  the resonance section resonates at a sixfold frequency of a frequency of the local signals.
(4) The signal processing apparatus according to (2) or (3), in which
  the resonance section includes a parallel LC circuit.
(5) The signal processing apparatus according to any one of (2) to (4), in which
  the resonant frequency is variable.
(6) The signal processing apparatus according to any one of (2) to (5), further including
  a voltage/current conversion section that converts a voltage into a current with respect to the differential signal, in which
  the mixing section mixes the local signals with the differential signal output from the voltage/current conversion section.
(7) The signal processing apparatus according to (6), further including
  a capacitor between an output of the voltage/current conversion section and a ground potential.
(8) The signal processing apparatus according to any one of (1) to (7), further including
  a differential amplification section that amplifies the differential signal, with which the local signals are mixed by the mixing section.
(9) The signal processing apparatus according to any one of (1) to (8), in which
  the mixing section includes a path of an I channel and a path of a Q channel and mixes the local signals having a mutual phase difference of 90 degrees with the I channel and the Q channel of the differential signal.
(10) The signal processing apparatus according to any one of (1) to (9), further including
  a local signal generation section that generates the local signals, in which
  the mixing section mixes the local signals with the differential signal, the local signals being generated by the local signal generation section.
(11) A signal processing method, including
  mixing two local signals with each signal of a differential signal and calculating a difference between results of the mixing of the two local signals, the two local signals having a 1/3 duty ratio and phases mutually shifted by a 1/2 period.
(12) A signal processing apparatus, including
  a generation section that generates two local signals to be mixed with a differential signal, the two local signals having a 1/3 duty ratio and phases mutually shifted by a 1/2 period.
(13) The signal processing apparatus according to (12), in which
  the generation section includes
    a plurality of flip-flops mutually connected in series in a ring form, and
    a computing section that calculates a logical OR of an input and an output of each of the flip-flops.
(14) The signal processing apparatus according to (13), in which
  the generation section causes each of the flip-flops to sequentially hold a value "1" according to an input clock signal.
(15) The signal processing apparatus according to any one of (12) to (14), in which
  a frequency of the clock signal is a sixfold frequency of a frequency of the local signals, and the generation section has a ring configuration constituted of the six flip-flops and the six computing sections and outputs the two local signals that are outputs of the two computing sections separated from each other with other two computing sections therebetween.

(16) The signal processing apparatus according to (15), in which
the generation section includes two sets of the ring configuration, and generates the local signal for the I channel by one of the sets of the ring configuration and the local signal for the Q channel by the other one of the sets of the ring configuration, the local signal for the Q channel having a phase difference of 90 degrees from the local signal for the I channel.

(17) The signal processing apparatus according to any one of (12) to (16), in which
the generation section includes a frequency divider section that generates the local signals having a 1/3 frequency and a 1/3 duty ratio with respect to a clock signal having a threefold frequency of a frequency of the local signals.

(18) The signal processing apparatus according to (17), in which
the frequency divider section includes
a counter that counts the clock signal,
a reset control section that resets the counter to "0" when an output value of the counter reaches "3", and
an output control section that outputs a value "1" when a value of the counter is "2", and outputs a value "0" when the output value of the counter is "1" or "0".

(19) The signal processing apparatus according to any one of (12) to (18), further including
a mixing section that mixes the local signals generated by the generation section with each signal of the differential signal.

(20) A signal processing method, including
generating two local signals to be mixed with a differential signal, the two local signals having a 1/3 duty ratio and phases mutually shifted by a 1/2 period.

(21) A signal processing apparatus, including
a mixing section that has a differential configuration, mixes two local signals with each signal of a differential signal, and calculates a difference between results of the mixing of the two local signals, the two local signals having a 1/3 duty ratio and phases mutually shifted a 1/2 period, the mixing section short-circuiting a signal line to a predetermined potential in a case where both the two local signals are Low, the signal line transmitting the input differential signal.

(22) The signal processing apparatus according to (21), in which
the mixing section includes
a first switch that mixes a first local signal with a negative-side signal of the differential signal, the first local signal having a 1/3 duty ratio,
a second switch that mixes a second local signal with a positive-side signal of the differential signal, the second local signal having a 1/3 duty ratio and a phase shifted by a 1/2 period with respect to the first local signal,
a third switch that mixes the second local signal with the negative-side signal of the differential signal, and
a fourth switch that mixes the first local signal with the positive-side signal of the differential signal, and
the mixing section combines a signal output from the first switch and a signal output from the second switch with each other to output a resultant signal as the negative-side signal of the differential signal, and
the mixing section combines a signal output from the third switch and a signal output from the fourth switch with each other to output a resultant signal as the positive-side signal of the differential signal.

(23) The signal processing apparatus according to (22), in which
the mixing section further includes
a fifth switch that short-circuits a signal line to the predetermined potential in a case where both the two local signals are Low, the signal line transmitting the negative-side signal of the input differential signal and being on an input side relative to the first switch and the third switch, and
a sixth switch that short-circuits a signal line to the predetermined potential in a case where both the two local signals are Low, the signal line transmitting the positive-side signal of the input differential signal and being on an input side relative to the second switch and the fourth switch.

(24) The signal processing apparatus according to (23), further including
a generation section that generates the two local signals.

(25) The signal processing apparatus according to (24), in which
the generation section further generates a control signal that controls the fifth switch and the sixth switch.

(26) The signal processing apparatus according to (25), in which
the generation section generates a signal representing a NOR of values of the two local signals generated, as the control signal.

(27) The signal processing apparatus according to any one of (21) to (26), in which
the predetermined potential is a ground potential.

(28) The signal processing apparatus according to any one of (21) to (26), in which
the predetermined potential is an optional common potential.

(29) A signal processing method, including:
mixing two local signals with each signal of a differential signal and calculating a difference between results of the mixing of the two local signals, the two local signals having a 1/3 duty ratio and phases mutually shifted a 1/2 period; and
short-circuiting a signal line to the predetermined potential in a case where both the two local signals are Low, the signal line transmitting the input differential signal.

(30) A signal processing apparatus, including
a mixing section that has a differential configuration, mixes two local signals with each signal of a differential signal, and calculates a difference between results of the mixing of the two local signals, the two local signals having a 1/3 duty ratio and phases mutually shifted by a 1/2 period, the mixing section short-circuiting signal lines with each other in a case where both the two local signals are Low, the signal lines transmitting the input differential signal.

(31) The signal processing apparatus according to (30), in which
the mixing section includes
a first switch that mixes a first local signal with a negative-side signal of the differential signal, the first local signal having a 1/3 duty ratio,
a second switch that mixes a second local signal with a positive-side signal of the differential signal, the second local signal having a 1/3 duty ratio and a phase shifted by a period with respect to the first local signal, a third switch that mixes the second local signal with the negative-side signal of the differential signal, and a fourth switch that mixes the first local signal with the positive-side signal of the differential signal, and the mixing section combines a signal output from the first switch and a signal output from the second switch with each other to output a resultant signal as the negative-side signal of the differential signal, and the mixing section combines a signal output from the third switch and a signal output from the fourth switch with each other to output a resultant signal as the positive-side signal of the differential signal.

(32) The signal processing apparatus according to (31), in which the mixing section further includes a fifth switch that short-circuits a signal line transmitting the negative-side signal of the input differential signal and being on as input side relative to the first switch and the third switch, and a signal line transmitting the positive-side signal of the input differential signal and being on an input side relative to the second switch and the fourth switch, with each other in a case where both the two local signals are Low.

(33) The signal processing apparatus according to (32), further including a generation section that generates the two local signals.

(34) The signal processing apparatus according to (33), in which the generation section further generates a control signal that controls the fifth switch.

(35) The signal processing apparatus according to (34), in which the generation section generates a signal representing a NOR of values of the two local signals generated, as the control signal.

(36) A signal processing method, including:

mixing two local signals with each signal of a differential signal and calculating a difference between results of the mixing of the two local signals, the two local signals having a 1/3 duty ratio and phases mutually shifted by a 1/2 period; and short-circuiting signal lines with each other in a case where both the two local signals are Low, the signal lines transmitting the input differential signal.

REFERENCE SIGNS LIST 100 frequency conversion apparatus
101 oscillation section
102 1/3 duty LO signal generation section
103 mixing section
111 amplification section
112 switch section
113 computing section
150 frequency conversion apparatus
151 voltage/current conversion section
152 mixing section
153 resonance section
154 amplification section
155 oscillation section
156 1/3 duty LO signal generation section
160 capacitor
171 switch
201 D-flip-flop
202 OR gate
251 counter
252 output control section
253 reset control section
254 computing section
300 frequency conversion apparatus
311 1/3 duty LO signal generation section
312 mixing section
321 D-flip-flop
322 NOT gate
323 NOR gate
331 switch
332 switch
333 switch

The invention claimed is:

1. A signal processing apparatus comprising:
   a mixing section that has a differential configuration, mixes two local signals with each signal of a differential signal, and calculates a difference between results of the mixing of the two local signals, the two local signals having a 1/3 duty ratio and phases mutually shifted by a 1/2 period; and
   a resonance section that resonates with the differential signal, with which the local signals are mixed by the mixing section, at a predetermined resonant frequency.

2. The signal processing apparatus according to claim 1, wherein
   the resonance section resonates at a sixfold frequency of a frequency of the local signals.

3. The signal processing apparatus according to claim 1, wherein
   the resonance section includes a parallel LC circuit.

4. The signal processing apparatus according to claim 1, wherein
   the resonant frequency is variable.

5. The signal processing apparatus according to claim 1, further comprising
   a voltage/current conversion section that converts a voltage into a current with respect to the differential signal, wherein
   the mixing section mixes the local signals with the differential signal output from the voltage/current conversion section.

6. The signal processing apparatus according to claim 5, further comprising
   a capacitor between an output of the voltage/current conversion section and a ground potential.

7. The signal processing apparatus according to claim 1, further comprising
   a differential amplification section that amplifies the differential signal, with which the local signals are mixed by the mixing section.

8. The signal processing apparatus according to claim 1, wherein
   the mixing section includes a path of an I channel and a path of a Q channel, mixes a first set of two local signals with each signal of the I channel of the differential signal, and mixes a second set of two local signals with each signal of the Q channel of the differential signal, corresponding local signals of the first set and the second set having a mutual phase difference of 90 degrees.

9. The signal processing apparatus according to claim 1, further comprising
   a local signal generation section that generates the local signals, wherein the mixing section mixes the local signals with the differential signal, the local signals being generated by the local signal generation section.

10. A signal processing method, comprising:

mixing two local signals with each signal of a differential signal and calculating a difference between results of the mixing of the two local signals, the two local signals having a 1/3 duty ratio and phases mutually shifted by a 1/2 period; and resonating with the differential signal, with which the local signals are mixed, at a predetermined resonant frequency.

11. The A signal processing apparatus comprising:

a generation section that generates two local signals to be mixed with a differential signal, the two local signals having a 1/3 duty ratio and phases mutually shifted by a 1/2 period, wherein the generation section includes a plurality of flip-flops mutually connected in series in a ring form, and a computing section that calculates a logical OR of an input and an output of each of the flip-flops.

12. The signal processing apparatus according to claim 11, wherein the generation section causes each of the flip-flops to sequentially hold a value "1" according to an input clock signal.

13. The signal processing apparatus according to claim 11, wherein a frequency of the clock signal is a sixfold frequency of a frequency of the local signals, and the generation section has a ring configuration constituted of the six flip-flops and the six computing sections and outputs the two local signals that are outputs of the two computing sections separated from each other with other two computing sections therebetween.

14. The signal processing apparatus according to claim 13, wherein the generation section includes two sets of the ring configuration, and generates a first set of two local signals for an I channel by one of the sets of the ring configuration and a second set of two local signals for a Q channel by the other one of the sets of the ring configuration, corresponding local signals of the first set and the second set having a phase difference of 90 degrees.

15. The signal processing apparatus according to claim 11, wherein the generation section includes a frequency divider section that generates the local signals having a 1/3 frequency and a 1/3 duty ratio with respect to a clock signal having a threefold frequency of a frequency of the local signals.

16. The signal processing apparatus according to claim 15, wherein the frequency divider section includes a counter that counts the clock signal, a reset control section that resets the counter to "0" when an output value of the counter reaches "3", and an output control section that outputs a value "1" when a value of the counter is "2", and outputs a value "0" when the output value of the counter is "1" or "0".

17. The signal processing apparatus according to claim 11, further comprising a mixing section that mixes the local signals generated by the generation section with each signal of the differential signal.

18. A signal processing method, comprising:

generating two local signals to be mixed with a differential signal, the two local signals having a 1/3 duty ratio and phases mutually shifted by a 1/2 period by a plurality of flip-flops mutually connected in series in a ring form; and calculating a logical OR of an input and an output of each of the flip-flops.

* * * * *